(12) United States Patent
Lee et al.

(10) Patent No.: US 11,508,730 B2
(45) Date of Patent: Nov. 22, 2022

(54) MEMORY DEVICES WITH VERTICAL CHANNELS

(71) Applicant: Samsung Electronics Co., Ltd., Suwon-si (KR)

(72) Inventors: Kyunghwan Lee, Seoul (KR); Yongseok Kim, Suwon-si (KR); Hyuncheol Kim, Seoul (KR); Satoru Yamada, Yongin-si (KR); Sungwon Yoo, Hwaseong-si (KR); Jaeho Hong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 149 days.

(21) Appl. No.: 17/032,040

(22) Filed: Sep. 25, 2020

(65) Prior Publication Data
US 2021/0193661 A1    Jun. 24, 2021

(30) Foreign Application Priority Data
Dec. 24, 2019  (KR) .......................... 10-2019-0173982

(51) Int. Cl.
*H01L 27/108* (2006.01)
*G11C 7/18* (2006.01)

(52) U.S. Cl.
CPC .......... *H01L 27/10805* (2013.01); *G11C 7/18* (2013.01)

(58) Field of Classification Search
CPC ......... H01L 27/10805; H01L 27/10844; H01L 27/108; H01L 29/1033; H01L 29/4232; H01L 27/10897; G11C 7/18
See application file for complete search history.

(56) References Cited

U.S. PATENT DOCUMENTS

| | | |
|---|---|---|
| 7,456,439 B1 | 11/2008 | Horch |
| 7,968,876 B2 | 6/2011 | Lung et al. |
| 8,441,059 B2 | 5/2013 | Sim et al. |
| 8,552,585 B2 | 10/2013 | Korec et al. |
| 8,772,858 B2 | 7/2014 | Hsu et al. |
| 9,202,571 B2 | 12/2015 | Shim et al. |
| 9,343,507 B2 | 5/2016 | Takaki |
| 2013/0113029 A1* | 5/2013 | Chung .............. H01L 27/10876 257/296 |

(Continued)

FOREIGN PATENT DOCUMENTS

KR      1480211      12/2014

*Primary Examiner* — Jerome Leboeuf
(74) *Attorney, Agent, or Firm* — Myers Bigel, P.A.

(57) ABSTRACT

Memory devices may include a source region, channels, a gate insulation layer pattern, a selection gate pattern, a first gate pattern, a second gate pattern and a drain region. The source region may include first impurities having a first conductivity type at an upper portion of a substrate. The channels may contact the source region. Each of the channels may extend in a vertical direction that is perpendicular to an upper surface of the substrate. The selection gate pattern may be on sidewalls of the channels. The first gate pattern may be on the sidewalls of the channels. The first gate pattern may be a common electrode of all of multiple channels. The second gate patterns may be on the sidewalls of the channels. The drain region may include second impurities having a second conductivity type that is different from the first conductivity type at an upper portion of each of the channels.

20 Claims, 41 Drawing Sheets

(56) References Cited

U.S. PATENT DOCUMENTS

| | | | |
|---|---|---|---|
| 2013/0256774 A1* | 10/2013 | Jeon | H01L 27/115 257/314 |
| 2016/0163856 A1* | 6/2016 | Doyle | H01L 29/66431 257/191 |
| 2019/0305085 A1* | 10/2019 | Sung | H01L 29/78696 |
| 2020/0091342 A1* | 3/2020 | Ok | H01L 29/66272 |

* cited by examiner

MEMORY DEVICES WITH VERTICAL CHANNELS

CROSS-REFERENCE TO RELATED APPLICATION

This application claims priority under 35 USC § 119 to Korean Patent Application No. 10-2019-0173982 filed on Dec. 24, 2019, in the Korean Intellectual Property Office (KIPO), the disclosure of which is incorporated by reference herein in its entirety.

FIELD

Example embodiments generally relate to memory devices and methods for manufacturing the same. More particularly, example embodiments relate to vertical channel memory devices and methods for manufacturing the same.

BACKGROUND

In a DRAM (dynamic random access memory) device, a unit cell may include one transistor and one capacitor. As DRAM devices are highly integrated, a limitation of a storage capacity of the capacitor and an increasing of leakage currents in the unit cell may become issues. Therefore, a memory device having no capacitor may be beneficial. Further, for high integration of a memory device, a vertical channel memory device including a vertical channel may be beneficial.

SUMMARY

Example embodiments provide highly integrated memory devices.

According to example embodiments, there are provided memory devices that may include a source region, channels, a gate insulation layer pattern, a selection gate pattern, a first gate pattern, a second gate pattern and a drain region. The source region may include first impurities having a first conductivity type at an upper portion of a substrate. The channels may contact the source region. Each of the channels may extend in a vertical direction perpendicular to an upper surface of the substrate. The plurality of channels may include a first channel and a second channel. A gate insulation layer pattern may surround or may cover a portion of the first channel. The selection gate pattern may be on the gate insulation layer pattern. The selection gate pattern may extend in a first direction that is parallel to the upper surface of the substrate. The first gate pattern may be on the gate insulation layer pattern. The second gate pattern may be on the gate insulation layer pattern. The second gate pattern may extend in parallel to the upper surface of the selection gate pattern. The drain region may include second impurities having a second conductivity type that is different from the first conductivity type at an upper portion of the first channel. The selection gate pattern, the first gate pattern, and the second gate pattern may be spaced apart from each other in the vertical direction. At least one of the source region and the first gate pattern may have a plate shape and may be a common electrode of the first channel and the second channel.

According to example embodiments, there are provided memory devices that may include a source region, channels, a gate insulation layer pattern, a selection gate pattern, a first gate pattern, a second gate pattern, a drain region and a bit line. The source region may include first impurities having a first conductivity type at an upper portion of a substrate. The channels may contact the source region. Each of the channels may extend in a vertical direction that is perpendicular to an upper surface of the substrate. The channels may be arranged in a first direction and a second direction that are parallel to the upper surface of the substrate and are perpendicular to each other. The gate insulation layer pattern may surround the channels. The selection gate patterns may be on the gate insulation layer pattern. The selection gate patterns may surround the channels arranged in the first direction, and may extend in the first direction. The channels may include a first channel, a second channel that is spaced apart from the first channel in the first direction, and a third channel that is spaced apart from the first channel in the second direction. The first gate pattern may be on the gate insulation layer pattern. The second gate pattern may be on the gate insulation layer pattern. The second gate patterns may surround the first and second channels or may cover a portion of each of the first and second channels, and may extend in the first direction. The drain region may include second impurities having a second conductivity type that is different from the first conductivity type at an upper portion of the first channel. The bit line may be electrically connected to the drain region. The bit line may extend in the second direction. The selection gate pattern, the first gate pattern, and the second gate pattern may be spaced apart from each other in the vertical direction. The first gate pattern may surround the first, second and third channels or may cover the portions of the first and second channel and a portion of the third channel and the first gate pattern may serve as a common gate of the first, second, and third channels.

According to example embodiments, there are provided memory devices that may include a source region, channels, a gate insulation layer pattern, selection gate patterns, a first gate pattern, second gate patterns, and drain regions. The source region may include first impurities having a first conductivity type at an upper portion of a substrate. The channels may contact the source region. Each of the channels may extend in a vertical direction that is perpendicular to an upper surface of the substrate. The selection gate patterns may be on sidewalls of the channels, respectively. The first gate pattern may be on the sidewalls of the channels. The first gate pattern may be a common electrode. The second gate patterns may be on the sidewalls of the channels, respectively. The drain regions may include second impurities having a second conductivity type that is different from the first conductivity type at respective upper portions of the channels.

In example embodiments, a unit cell of the memory device may be formed on the channel protruding from the upper surface of the substrate in the vertical direction. Thus, a degree of integration of the memory device may be increased. Also, at least one of gate patterns of the first and second transistors included in the unit cell may have a shape of one wide pattern, so that the gate pattern having the shape of one wide pattern may be shared with other unit cells. Therefore, processes for manufacturing the memory device may be simplified. Further, as the channels of transistors included in the unit cell may not doped with impurities, a variation or issues associated with doping processes may be decreased.

BRIEF DESCRIPTION OF THE DRAWINGS

Example embodiments will be more clearly understood from the following detailed description taken in conjunction with the accompanying drawings. FIGS. 1 to 45 represent non-limiting, example embodiments of the present inventive concept as described herein.

FIG. 1 is a cross-sectional view, FIG. 2 is a plan view, and FIGS. 3 and 4 are perspective views illustrating a memory device in accordance with example embodiments of the present inventive concept;

FIG. 5 is a circuit diagram of a unit cell of a memory device in accordance with example embodiments of the present inventive concept;

FIG. 6 is an I-V curve of a bit line in a unit cell in accordance with example embodiments of the present inventive concept;

FIG. 7 shows an energy band of a channel when data 0 is written in the unit cell in accordance with example embodiments of the present inventive concept;

FIG. 8 shows an energy band of a channel when data 1 is written in the unit cell in accordance with example embodiments of the present inventive concept;

FIG. 9 is a timing diagram of an applied voltage of a selected unit cell according to an operation of the memory device in accordance with example embodiments of the present inventive concept;

FIGS. 10 to 29 are cross-sectional views and plan views illustrating a method of manufacturing a memory device in accordance with example embodiments of the present inventive concept;

FIGS. 31 to 35 are cross-sectional views illustrating a method of manufacturing a memory device in accordance with example embodiments of the present inventive concept;

FIGS. 36 and 37 are cross-sectional views illustrating a memory device in accordance with example embodiments of the present inventive concept;

FIG. 38 is a circuit diagram of a unit memory cell in a memory device in accordance with example embodiments of the present inventive concept;

FIGS. 39 and 40 are cross-sectional views illustrating a memory device in accordance with example embodiments of the present inventive concept; and FIGS. 41 to 45 are circuit diagrams for illustrating memory devices in accordance with example embodiments of the present inventive concept, respectively.

DETAILED DESCRIPTION

Hereinafter, a direction that is substantially perpendicular to an upper surface of a substrate may be referred to as a vertical direction. Two directions that are substantially parallel to the upper surface of the substrate and traverse each other may be referred to as first and second directions, respectively. In some embodiments, the first and second directions may be substantially perpendicular to each other.

Figure 1:
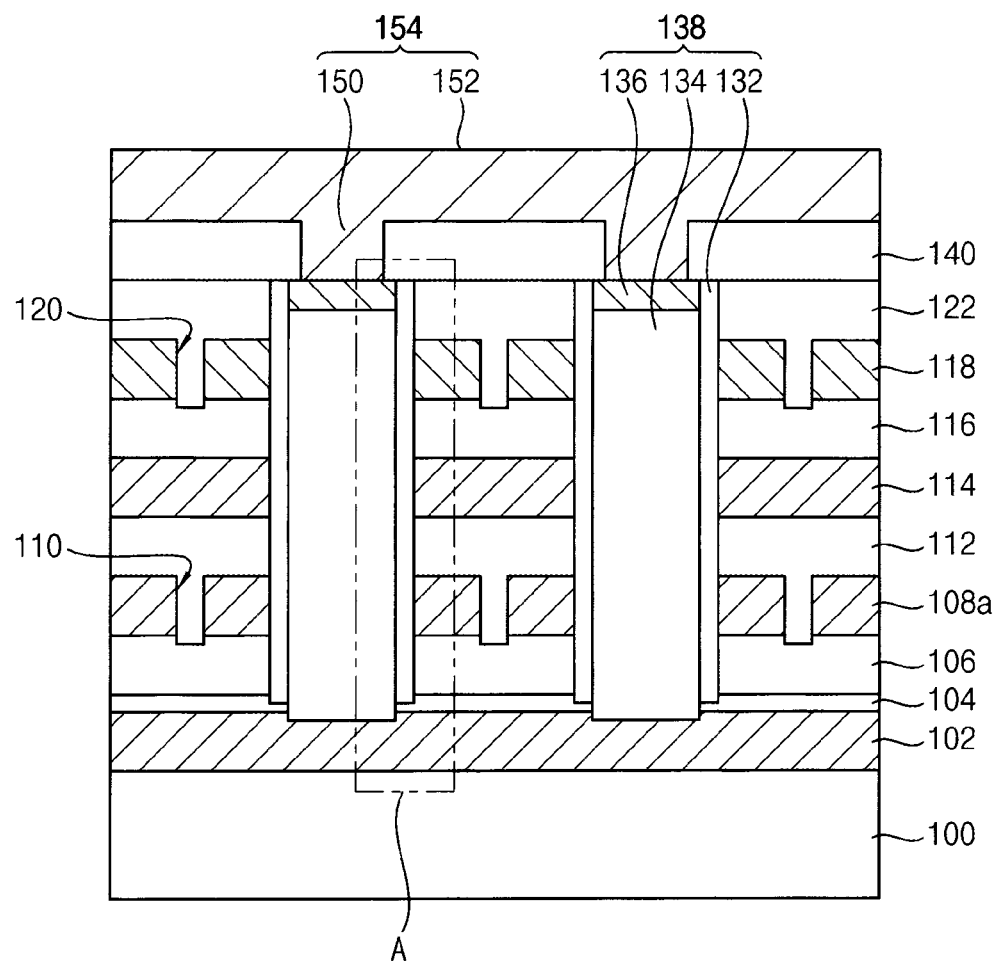
Figure 2:
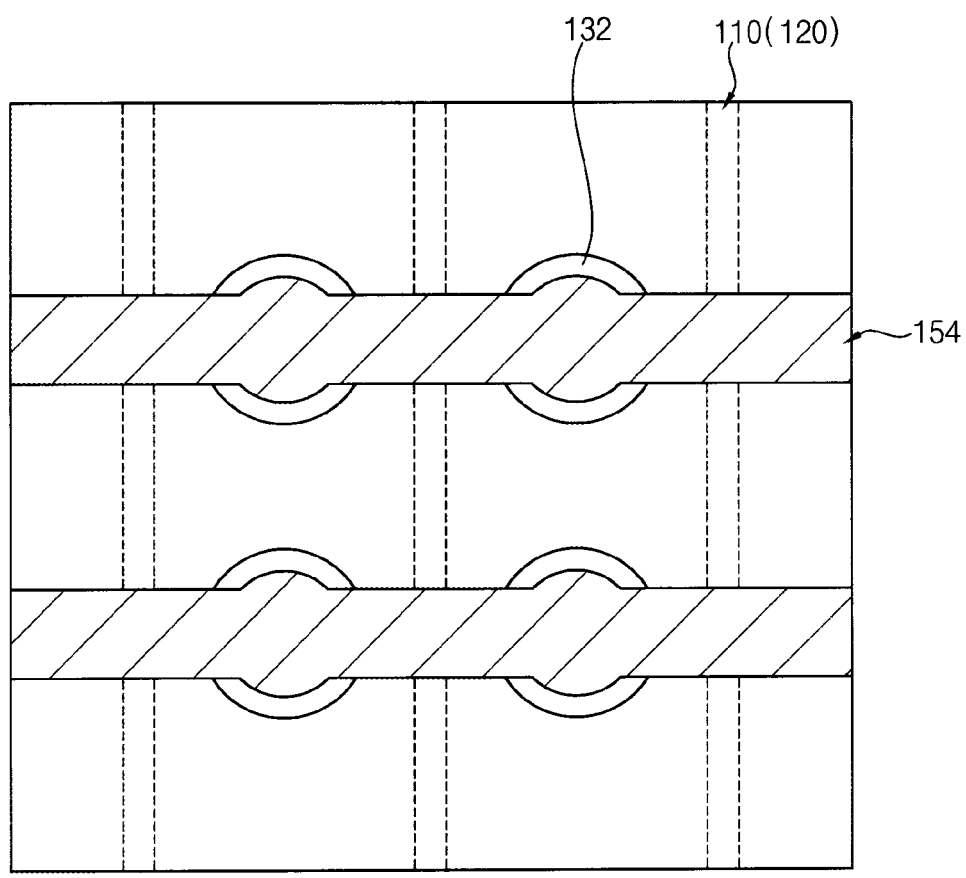
Figure 2:
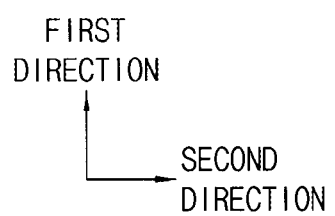
Figure 3:
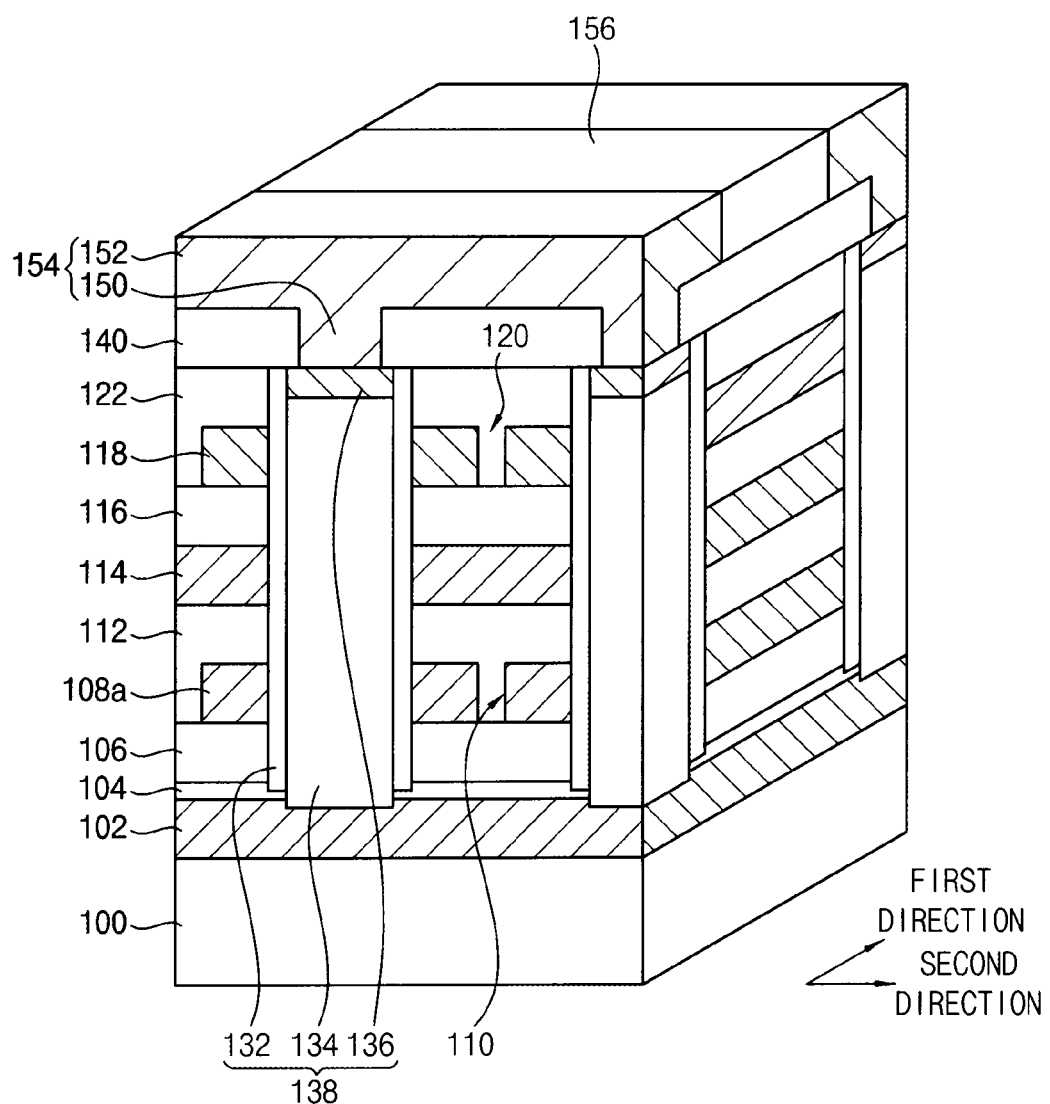
Figure 4:
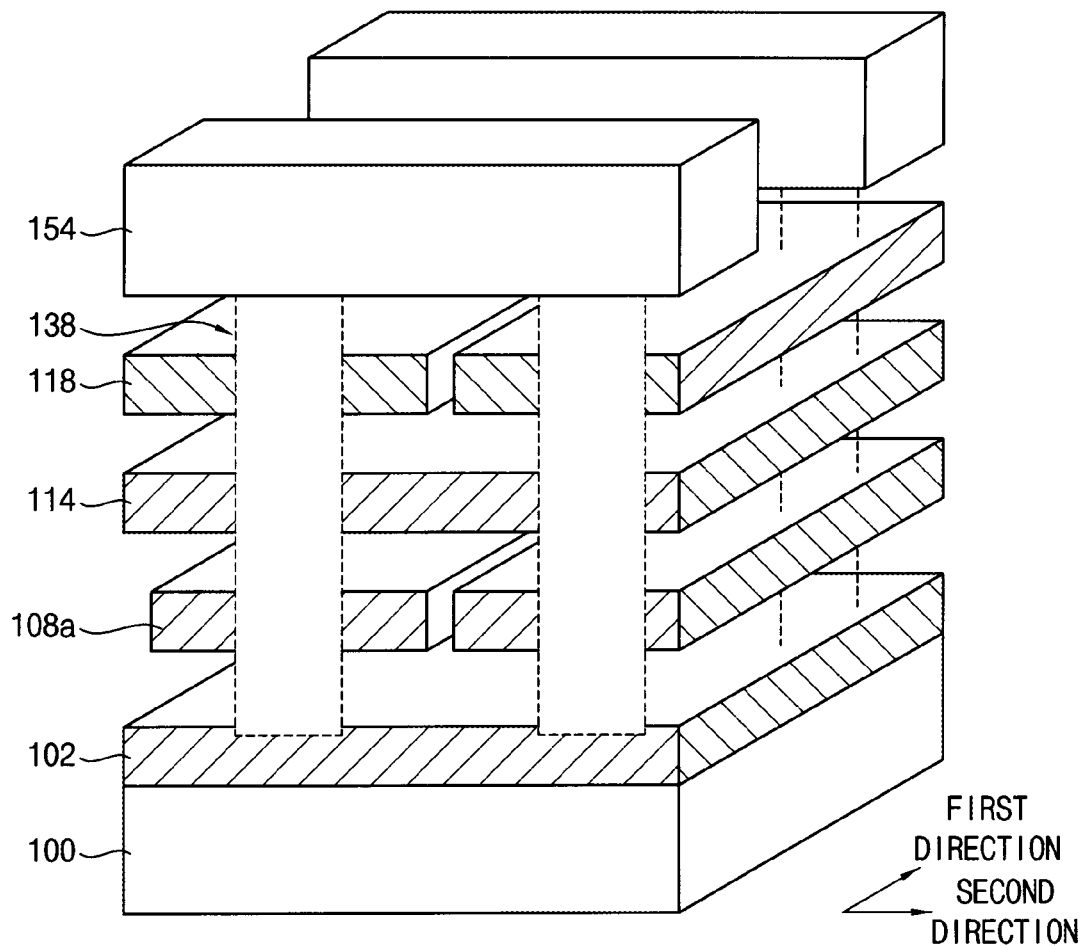
Figure 5:
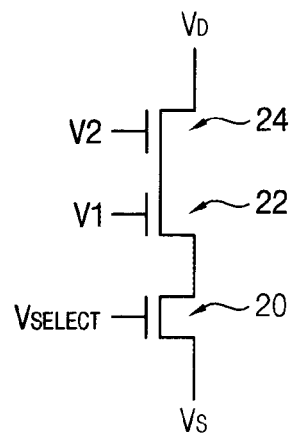

FIG. 1 is a cross-sectional view, FIG. 2 is a plan view, and FIGS. 3 and 4 are perspective views illustrating a memory device in accordance with example embodiments of the present inventive concept. FIG. 5 is a circuit diagram of a unit cell of a memory device in accordance with example embodiments of the present inventive concept.

FIG. 4 shows some elements of the memory device.

Referring to FIGS. 1 to 5, in the memory device, unit cells may be arranged in an array type on a cell region of a substrate 100.

Each of the unit cells may include a common source region 102, a selection transistor 20, a first transistor 22, a second transistor 24 and a drain region 136. Elements included in each of the unit cells may be arranged in the vertical direction.

The first transistor 22 and the second transistor 24 may be disposed adjacent to each other in series, and may have an energy barrier in a channel region. One of the gate patterns of the first and second transistors 22 and 24 may have an unpatterned shape, so that the gate pattern having the unpatterned shape may serve as a common gate pattern that is shared with other unit cells. The common gate pattern may be shared with multiple unit cells.

In the memory device, the common source region 102 may be formed at an upper portion of the substrate 100. A channel structure 138 may be formed on the common source region 102 of the substrate 100. A selection gate pattern 108a, a first gate pattern 114 and a second gate pattern 118 may be formed on a sidewall of the channel structure 138, and the selection gate pattern 108a, the first gate pattern 114 and the second gate pattern 118 may be spaced apart from each other in the vertical direction. A bit line structure 154 may be electrically connected to an upper surface of the channel structure 138.

The substrate 100 may include a semiconductor material such as silicon, germanium, or silicon-germanium, or a group III-V compound such as GaP, GaAs, GaSb, or the like. In some example embodiments, the substrate 100 may be a silicon-on-insulator (SOI) substrate or a germanium-on-insulator (GOI) substrate.

The common source region 102 may be a region that includes impurities having a first conductivity type. In some embodiments, the common source region 102 may be the upper portion of the substrate 100 doped with impurities having a first conductivity type. For example, the first conductivity type may be an N type. An upper surface of the substrate 100 may correspond to the common source region 102.

In example embodiments, the common source region 102 may be formed in an entire upper portion of the substrate 100 of the cell region. That is, the common source region 102 may have a single plate shape. Thus, a device isolation pattern may not be formed at the substrate 100 of the cell region. The common source region 102 may serve as a common source of all unit cells formed on the substrate 100 of the cell region.

In some example embodiments, each of common source regions 102 may have a line shape extending in the first direction or the second direction. In this case, the device isolation pattern may be formed at the substrate 100 between the common source regions 102. As used herein, "an element A extends in a direction X" (or similar language) may mean that the element A extends longitudinally in the direction X.

A lower sacrificial layer 104 may be formed on the substrate 100. A first insulating interlayer 106 may be formed on the lower sacrificial layer 104.

The lower sacrificial layer 104 may include an insulation material having an etch selectivity with respect to a silicon oxide. In example embodiments, the lower sacrificial layer 104 may include silicon nitride or aluminum oxide. The first insulating interlayer 106 may include silicon oxide. Each of insulating interlayers described below may also include silicon oxide.

The selection gate patterns 108*a* may be formed on the first insulating interlayer 106. Thus, the selection gate patterns 108*a* may be spaced apart from the upper surface of the substrate 100 in the vertical direction. The selection gate patterns 108*a* may have a line shape extending in the first direction. Also, the selection gate patterns 108*a* may be spaced apart from each other in the second direction.

Each of the selection gate patterns 108*a* may serve as a gate electrode of the selection transistor 20.

In order to speed up an operation of the memory device, the selection gate patterns 108*a* may have low resistance. In example embodiments, the selection gate patterns 108*a* may include a polysilicon doped with impurities. In some example embodiments, the selection gate patterns 108*a* may include a metal material having a resistance lower than a resistance of the polysilicon.

A second insulating interlayer 112 may be formed on the first insulating interlayer 106 and the selection gate pattern 108*a* to fill a space between the selection gate patterns 108*a*. An upper surface of the second insulating interlayer 112 may be flat.

The first gate pattern 114 may be formed on the second insulating interlayer 112. The first gate pattern 114 may be spaced apart from the selection gate patterns 108*a* in the vertical direction. In example embodiments, the first gate pattern 114 may have a shape of wide one pattern. That is, the first gate pattern 114 may have a single plate shape. Therefore, the first gate pattern 114 may serve as a common gate electrode of the first transistors 22. In some embodiments, the single first gate pattern 114 may be a gate electrode of all of the multiple first transistors 22 and may be referred to as a common gate electrode of the multiple first transistors 22. In some embodiments, the single first gate pattern 114 may be a gate electrode corresponding to multiple channels 134 of the first transistors 22 and may be referred to as a common electrode of all of the multiple channels 134.

In example embodiments, the first transistor 22 may serve as a transistor for modulation of electronic energy barrier. In this case, the first transistor 22 may have a high energy barrier, and thus the first gate pattern 114 may have a high work function. In example embodiments, the first gate pattern 114 may include a material having a first work function of 4.5 eV or more.

In example embodiments, the first gate pattern 114 may include a polysilicon doped with P-type impurities. In some example embodiments, the first gate pattern 114 may include a metal having the first work function.

A third insulating interlayer 116 may be formed on the first gate pattern 114. The upper surface of the third insulating interlayer 116 may be flat.

The second gate patterns 118 may be formed on the third insulating interlayer 116. The second gate patterns 118 may be spaced apart from the first gate pattern 114 in the vertical direction. In example embodiments, each of the second gate patterns 118 may have a line shape extending in the first direction. Also, the second gate patterns 118 may be spaced apart from each other in the second direction. Thus, the second gate patterns 118 may be disposed to face the selection gate patterns 108*a*, respectively. Each of the second gate patterns 118 may serve as a gate electrode of the second transistor 24.

In example embodiments, the second transistor 24 may serve as a transistor for modulation of a hole energy barrier. In this case, the second transistor 24 may have a low energy barrier, and the second gate pattern 118 may have a second work function lower than the first work function. In example embodiments, the second gate pattern 118 may include a conductive material having a work function lower than 4.5 eV.

In example embodiments, the second gate pattern 118 may include a polysilicon doped with N-type impurities. In some example embodiments, the second gate pattern 118 may include a metal having the second work function.

A fourth insulating interlayer 122 may be formed on the third insulating interlayer 116 and the second gate patterns 118 to fill a space between the second gate patterns 118. An upper surface of the fourth insulating interlayer 122 may be flat.

As described above, a stacked structure including the lower sacrificial layer 104, the first insulating interlayer 106, the selection gate patterns 108*a*, the second insulating interlayer 112, the first gate pattern 114, the third insulating interlayer 116, the second gate patterns 118, and the fourth insulating interlayer 122 may be formed on the substrate 100 of the cell region.

A plurality of channel structures 138 may pass through the stacked structure. Each of the channel structures 138 may be formed in a channel hole passing through the stacked structure and exposing the common source region 102.

The channel structure 138 may pass through the second gate pattern 118, the first gate pattern 114, the selection gate pattern 108*a*, the lower sacrificial layer 104, and the first to fourth insulating interlayers 106, 112, 116 and 122, and the channel structure 138 may extend to the common source region 102 of the substrate 100. The channel structure 138 may have a pillar shape. "An element having a pillar shape" (or similar language) as used herein refers to an element that includes a bottom surface and a vertical portion extending from the bottom surface in a vertical direction. The vertical portion may or may not be perpendicular to the bottom surface.

The channel structure 138 may pass through the second gate pattern 118 and the selection gate pattern 108*a* together. The channel structures 138 may be regularly arranged in the first and second directions. Each of the selection gate pattern 108*a*, the first gate pattern 114, and the second gate pattern 118 may cover at least a portion of the channel structure 138 or may extend around the channel structure 138. In some embodiments, each of the selection gate pattern 108*a*, first gate pattern 114, and the second gate pattern 118 may enclose the channel structure 138 as illustrated in FIGS. 3 and 4. As used herein, "an element A covers or extends around an element B" (or similar language) means that the element A extends on the element B but does not necessarily mean that the element A covers the element B entirely or the element A completely encloses the element B.

The channel structure 138 may include a channel 134, a gate insulation layer pattern 132 on an outer wall of the channel 134, and a drain region 136 at an upper portion of the channel 134.

In some embodiments, the drain region 136 may be formed by doping with impurities of the upper portion of the channel 134, the channel 134 and the drain region 136 may include the same semiconductor material. In example embodiments, the channel 134 and the drain region 136 may include polysilicon or single crystalline silicon.

In example embodiments, the channel 134 may have a pillar shape. In some embodiments, the channel 134 may have a hollow cylinder shape. In this case, a buried insulation pattern may be further formed to fill an inner space of the channel 134. A bottom of the channel 134 may contact the common source region 102, so that the channel 134 and the common source region 102 may be electrically connected to each other.

A first surface of the gate insulation layer pattern 132 may contact the channel 134. Also, a second surface of the gate insulation layer pattern 132 may contact the second gate pattern 118, the first gate pattern 114, and the selection gate pattern 108a.

Therefore, a stacked structure including the channel 134, the gate insulation layer pattern 132, and the selection gate pattern 108a may serve as the selection transistor 20. A stacked structure including the channel 134, the gate insulation layer pattern 132, and the first gate pattern 114 may serve as the first transistor 22. A stacked structure including the channel 134, the gate insulation layer pattern 132, and the second gate pattern 118 may serve as the second transistor 24.

In example embodiments, the channel 134 may include an intrinsic semiconductor material that is not doped with impurities.

The drain region 136 may be doped with impurities having a second conductivity type different from the first conductivity type. For example, the second conductivity type may be a P type.

A fifth insulating interlayer 140 may be formed on the fourth insulating interlayer 122 and the channel structure 138.

A bit line contact 150 may pass through the fifth insulating interlayer 140. The bit line contact 150 may be electrically connected to the drain region 136 of the channel structure 138. Also, a bit line 152 extending in the second direction may be formed on the bit line contact 150. That is, the bit line 152 may extend in a direction perpendicular to the extending direction of the first and second gate patterns 114 and 118. The bit line structure 154 may include the bit line contact 150 and the bit line 152.

A sixth insulating interlayer 156 may be formed on the fifth insulating interlayer 140 to fill a space between a plurality of bit lines 152.

As described above, each of the unit cells of the memory device may include the first transistor 22 and the second transistor 24 having an energy barrier. One of the first and second transistors 22 and 24 may include a gate pattern having an unpatterned shape. That is, the one of the first and second transistors 22 and 24 may serve as a common gate pattern shared with other unit cells in the cell region. Thus, processes for forming the gate pattern may be simplified, and defects of the memory device may be decreased.

Further, in the memory device, each of elements included in the unit cells may be stacked in the vertical direction. Therefore, a horizontal area of the substrate for forming the unit cells may be decreased, so that the memory device may be highly integrated.

Hereinafter, a method for operating the unit cells of the memory device in accordance with example embodiments may be described.

Figure 6:
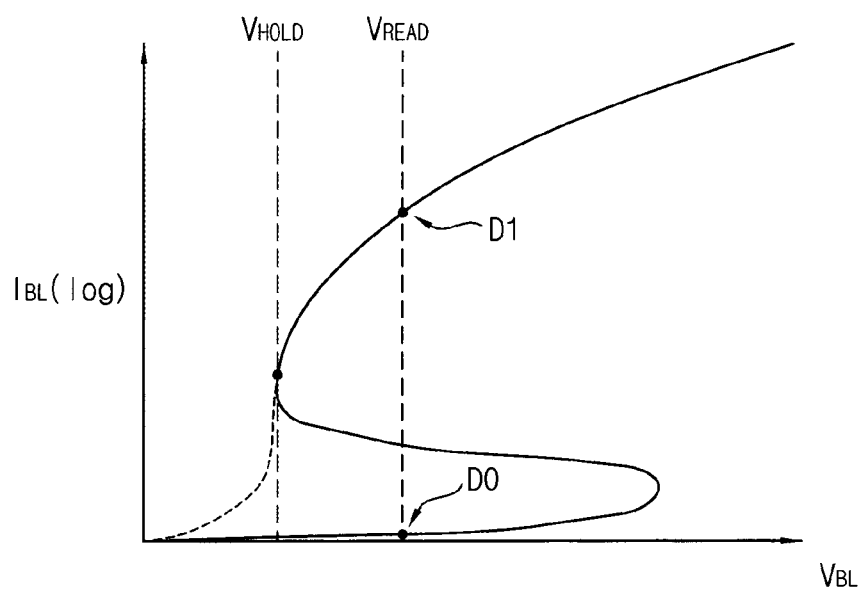
Figure 7:
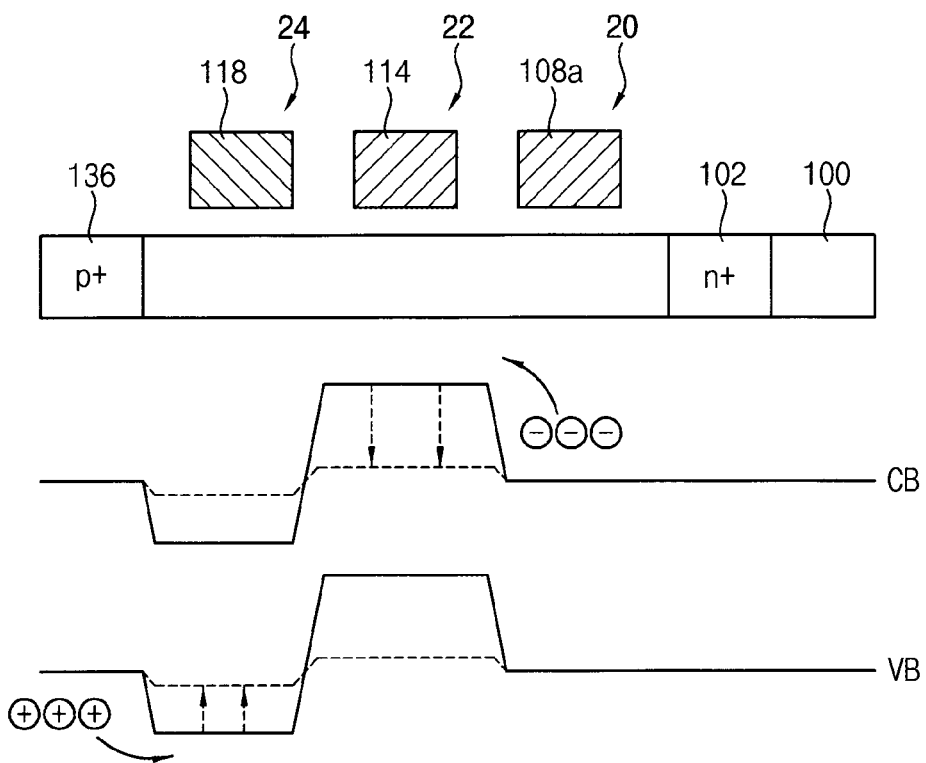
Figure 8:
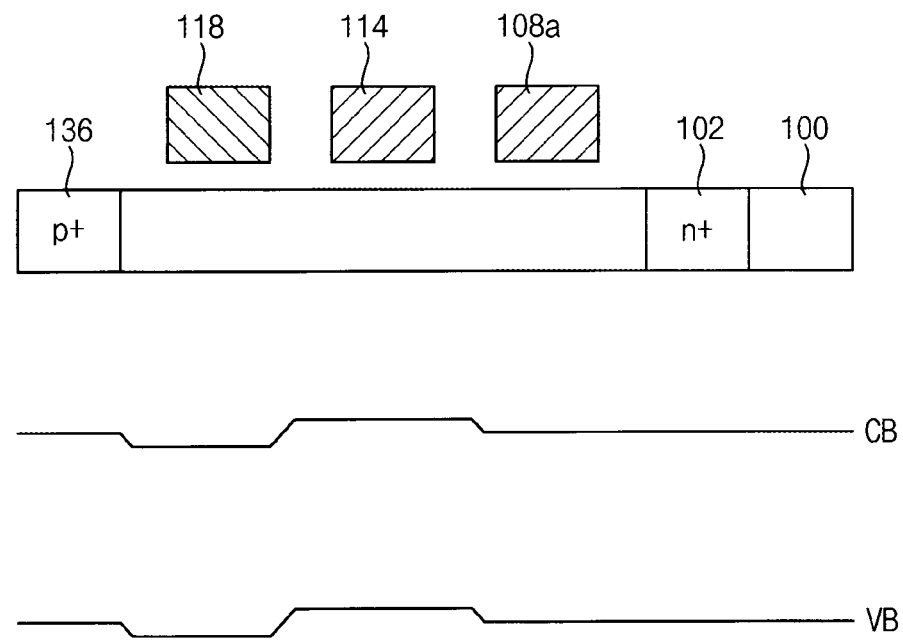

FIG. 6 is an I-V curve of a bit line in a unit cell in accordance with example embodiments of the present inventive concept. FIG. 7 shows an energy band of a channel when data 0 is written in the unit cell in accordance with example embodiments of the present inventive concept. FIG. 8 shows an energy band of a channel when data 1 is written in the unit cell in accordance with example embodiments of the present inventive concept.

In FIGS. 7 and 8, a portion A of FIG. 1 is illustrated in a horizontal direction. As shown in FIGS. 7 and 8, the drain region 136, the second transistor 24, the first transistor 22, the selection transistor 20, and the source region 102 may be sequentially arranged from the bit line structure.

The channel of the unit cell may have a high energy barrier due to a difference between work functions of the first and second gate patterns 114 and 118. Further, the energy barrier of the channel may be adjusted by an applied voltage of the first gate pattern 114 and an applied voltage of the second gate pattern 118.

Referring to FIG. 6, bit line currents ($I_{B/L}$) may have hysteresis characteristics. Thus, in the unit cell, a curve of the bit line currents ($I_{B/L}$)-bit line voltage ($V_{B/L}$) may be operated as a thyristor.

FIGS. 6 and 7, the unit cell may be adjusted the applied voltage of the first gate pattern 114 and the applied voltage of the second gate pattern 118 to have a high energy barrier at the channel, and thus data 0 may be written in the unit cell. In this case, currents may hardly flow through the unit cell, and data 0 may be read by sensing the currents.

FIGS. 6 and 8, the unit cell may be adjusted the applied voltage of the first gate pattern 114 and the applied voltage of the second gate pattern 118 to have a low energy barrier at the channel. Thereafter, a positive feedback loop may be generated, and thus the energy barrier of the channel may be collapses. Therefore, data 1 may be written in the unit cell. In this case, currents may flow through the unit cell, and data 1 may be read by sensing the currents.

When the unit cell is operated, a voltage between the common source region 102 and the drain region 136 may be controlled by adjusting an applied voltage of the selection gate pattern 108a.

Hereinafter, a method of performing a write operation, a read operation, and a maintenance operation of data in the memory device may be described in detail. The memory device may be operated as a DRAM device.

Figure 9:
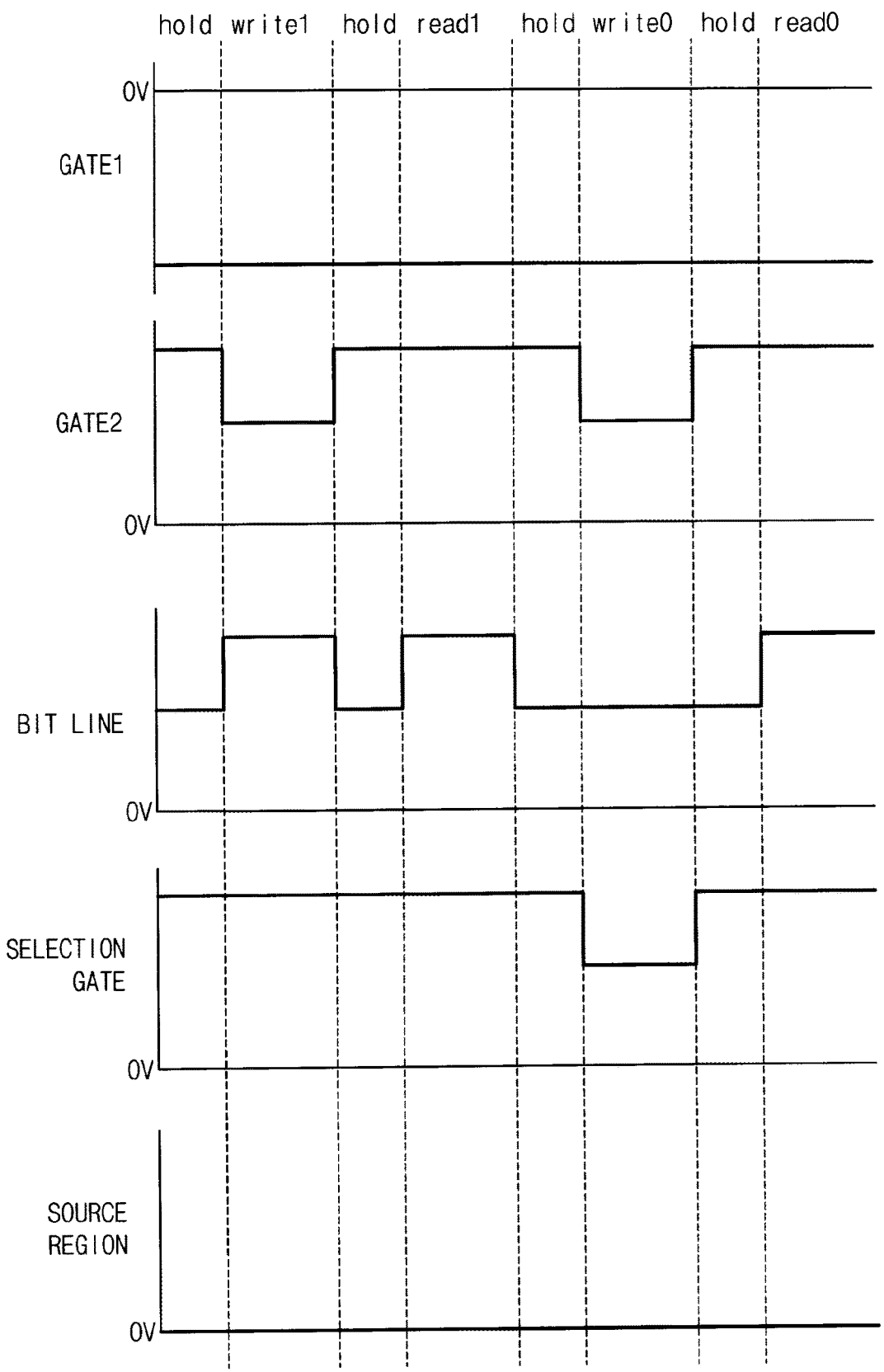

FIG. 9 is a timing diagram of an applied voltage of a selected unit cell according to an operation of the memory device in accordance with example embodiments of the present inventive concept.

A table 1 is a specific example of the applied voltage of the selected unit cell. However, the applied voltage is not limited thereof.

TABLE 1

|  | First gate | Second gate | Selection gate | Bit line |
| --- | --- | --- | --- | --- |
| Write data 1 | −1.2 V (First voltage) | 0.8 V (Second voltage) | 0.7 V (Turn-on voltage) | 1.1 V (First bit line voltage) |
| Write data 0 | −1.2 V | 0.8 V | 0.1 V (Turn-off voltage) | 0.67 V (Second bit line voltage) |
| Read | −1.2 V | 1.2 V (Third voltage) | 0.7 V | 1.1 V |
| Data hold | −1.2 V | 1.2 V | 0.7 V | 0.67 V |

Write Data 1

When data 1 is written in the unit cell, the selection transistor 20 of the selected unit cell may be fully turned on. Therefore, a turn-on voltage may be applied to the selection gate.

In each of the operations, the same first voltage may be applied to the first gate pattern 114. The first voltage may be a negative voltage. Thus, in an initial state, the energy barrier of the channel facing the first gate pattern 114 may be maintained as high level.

A second voltage may be applied to the second gate pattern 118, and a first bit line voltage may be applied to the bit line.

In this case, the energy barrier between the channels facing the first gate pattern 114 and the second gate pattern 118 may be decreased, and thus holes may be injected into the channel facing the second gate pattern 118. Also, electrons may be injected into the channel facing the first gate patterns 114. As the positive feedback loop is generated, the energy barrier may be collapsed. Thus, the energy barrier between the channels facing the first gate pattern 114 and the second gate pattern 118 are lowered, so that drain currents may flow through the channel.

Write Data 0

When data 0 is written in the unit cell, the selection transistor 20 of the selected unit cell may be fully turned off. Therefore, a turn-off voltage may be applied to the selection gate.

The second voltage may be applied to the second gate pattern 118, and a second bit line voltage may be applied to the bit line. The second bit line voltage may be lower than the first bit line voltage.

The first voltage may be applied to the first gate pattern 114, so that the energy barrier of the channel facing the first gate pattern 114 may be maintained as high level. A constant DC voltage may be applied to the first gate pattern 114.

In this case, the channel facing the second gate pattern 118 may have an energy barrier lower than that of the drain region 136. Thus, the energy barrier between the channels facing the first gate pattern 114 and the second gate pattern 118 are high, so that the drain current may hardly flow through the channel.

Hold Data 1 or Data 0

After writing data to the selected unit cell, the written data may be maintained. Applied voltages for maintaining the data may be similar to the applied voltages for writing data 0. However, a turn-on voltage may be applied to the selection gate pattern. Also, a third voltage may be applied to the second gate pattern 118, and the third voltage may be higher than the second voltage. Therefore, data may not be written in the unit cell, and data written in the unit cell may be maintained.

Reading Data

Applied voltages for reading the data may be similar to the applied voltages for holding the data. However, a second bit line voltage may be applied to the bit line. Therefore, data may not be written in the unit cell. Data written in the selected unit cell may be distinguished by measuring a current flowing through the selected unit cell.

FIGS. 10 to 29 are cross-sectional views and plan views illustrating a method of manufacturing a memory device in accordance with example embodiments of the present inventive concept.

Figure 10:
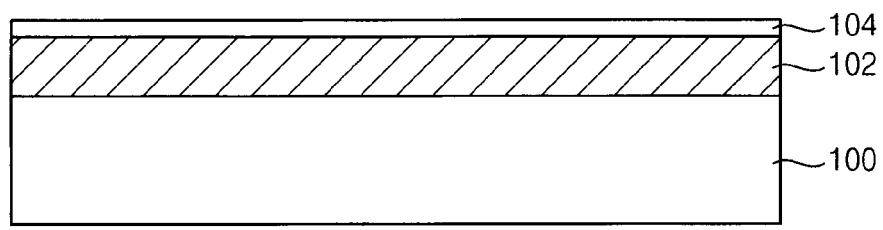
Figure 11:
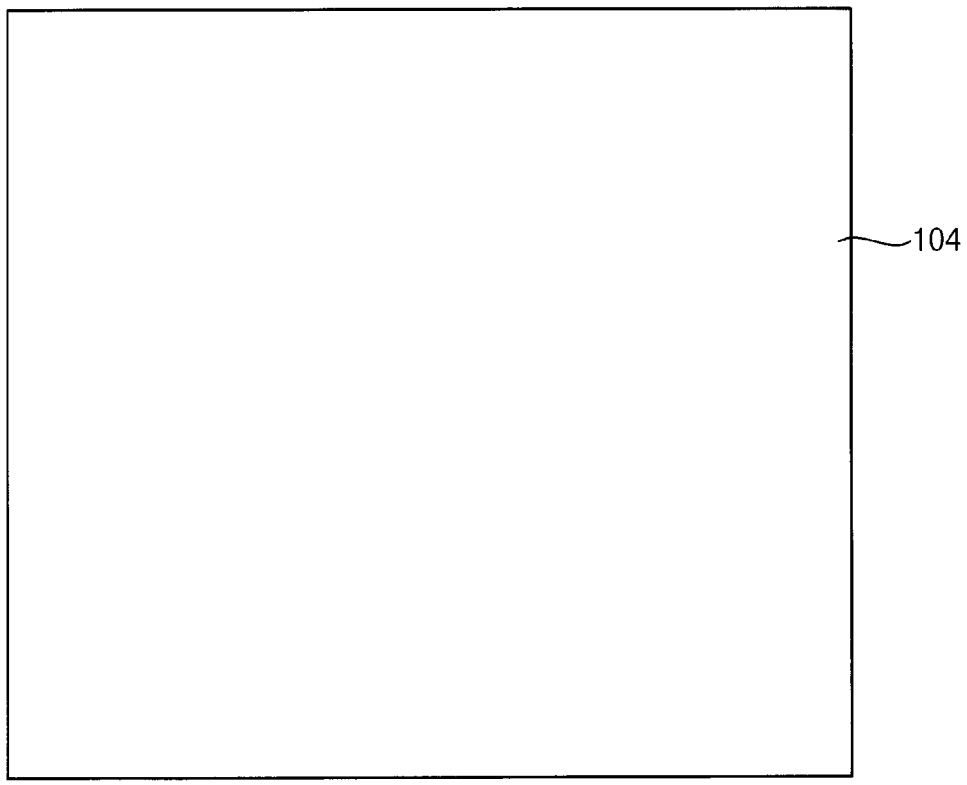
Figure 11:
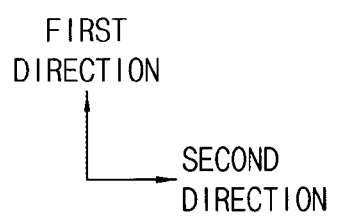

Referring to FIGS. 10 and 11, a substrate 100 of a cell region may be doped with impurities having the first conductivity type to form a common source region 102 at upper portion of the substrate 100.

A lower sacrificial layer 104 may be formed on the common source region 102 of the substrate 100. The lower sacrificial layer 104 may serve as an etch stop layer and an impurity diffusion barrier layer. In some example embodiments, the lower sacrificial layer 104 may not be formed.

Figure 12:
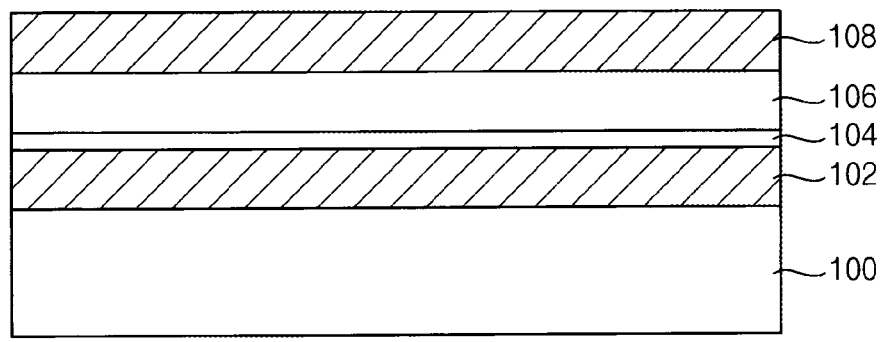
Figure 13:
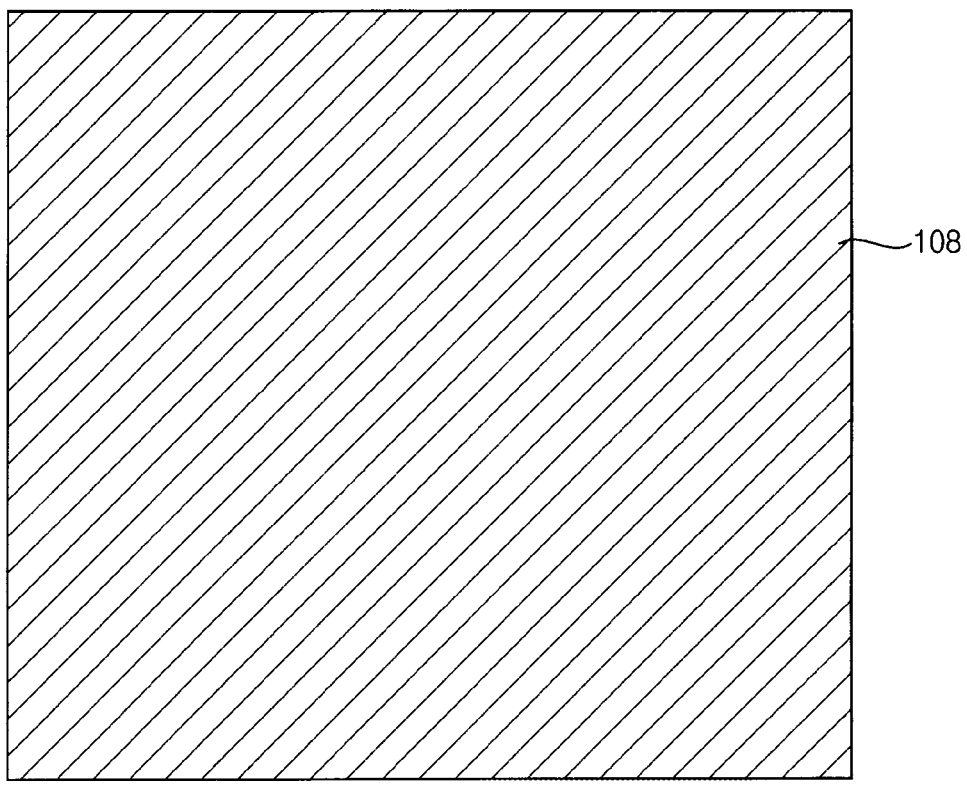
Figure 13:
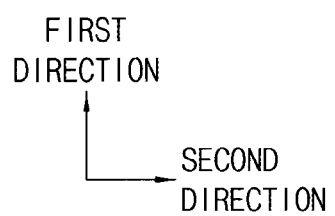

Referring to FIGS. 12 and 13, a first insulating interlayer 106 may be formed on the lower sacrificial layer 104. A selection gate layer 108 may be formed on the first insulating interlayer 106.

In example embodiments, the selection gate layer 108 may include a polysilicon doped with impurities. The impurity may be an N-type impurity or a P-type impurity.

Figure 14:
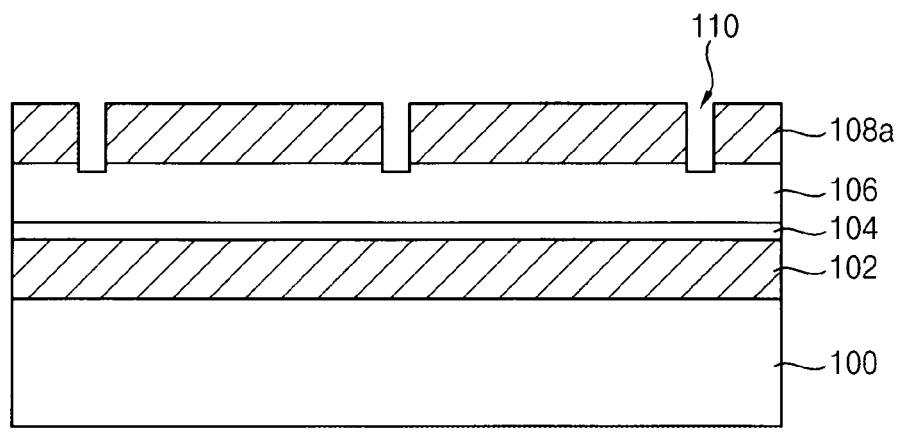
Figure 15:
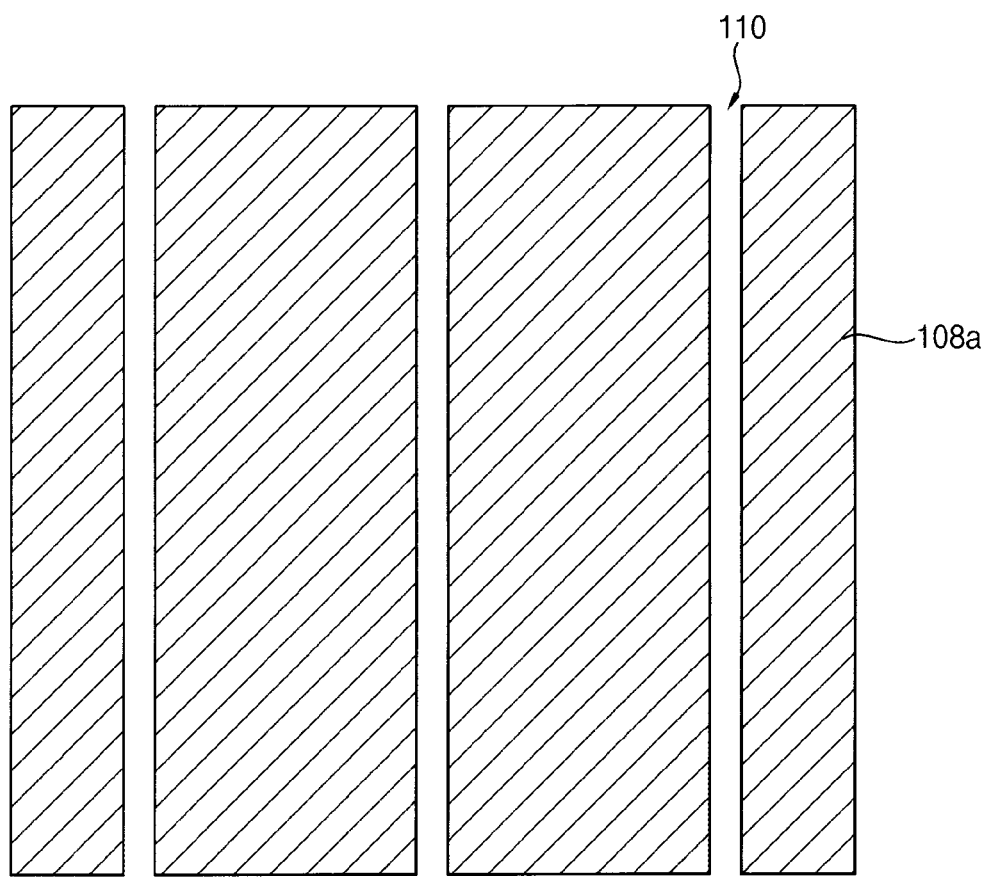

Referring to FIGS. 14 and 15, the selection gate layer 108 may be patterned to form selection gate patterns 108a. Each of the selection gate patterns 108a may have a line shape extending in the first direction. A first trench 110 extending in the first direction may be formed between the selection gate patterns 108a.

Figure 16:
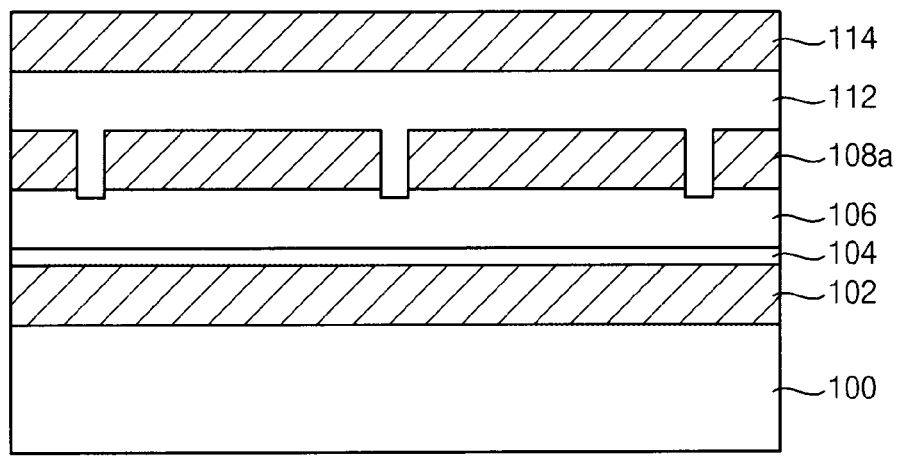
Figure 16:
Figure 17:
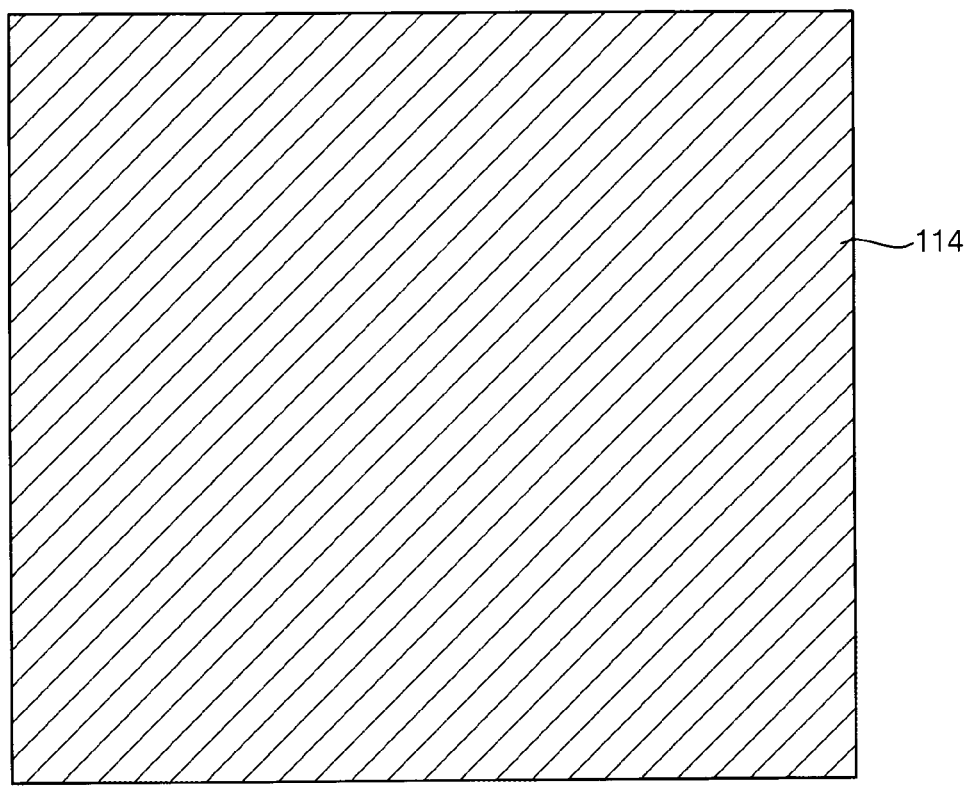
Figure 17:
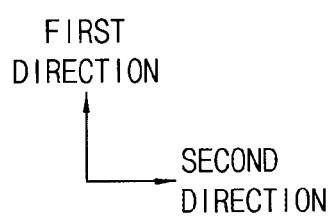

Referring to FIGS. 16 and 17, a second insulating interlayer 112 may be formed on the selection gate patterns 108a to fill the first trench 110 between the selection gate patterns 108a.

In example embodiments, an insulation layer may be formed to fill the first trench 110 between the selection gate patterns 108a. The insulation layer may be planalized until an upper surface of the selection gate pattern 108a may be exposed. Thereafter, an insulation layer may be further formed on the selection gate patterns 108a and the insulation layer to form the second insulating interlayer 112. Therefore, an upper surface of the second insulating interlayer 112 may be flat.

A first gate layer 114 may be formed on the second insulating interlayer 112.

The first gate layer 114 may include a conductive material having a first work function. In example embodiments, the first gate layer 114 may be a polysilicon layer doped with P-type impurities.

A patterning process of the first gate layer 114 may not be performed. Thus, the first gate layer 114 may be formed on the substrate 100 of the cell region, and may serve as a common first gate pattern of the first transistors. The single first gate layer 114 may be a gate of all of the multiple first transistors. Hereinafter, the first gate layer 114 is referred to as a first gate pattern and given the same reference numerals as the first gate layer 114. As a patterning process of the first gate layer 114 is not performed, processes may be simplified and process defects may be decreased.

Figure 18:
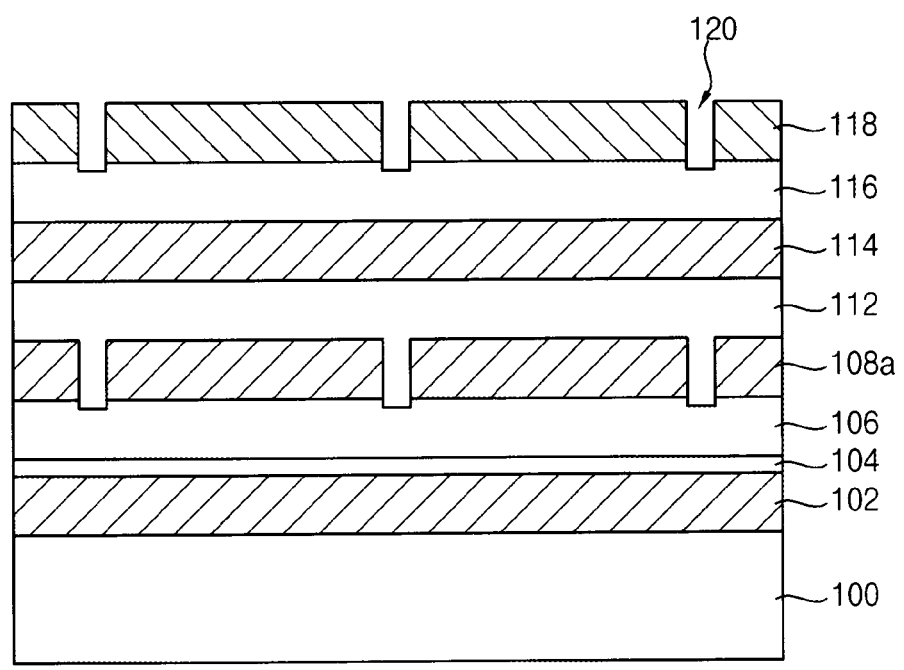
Figure 19:
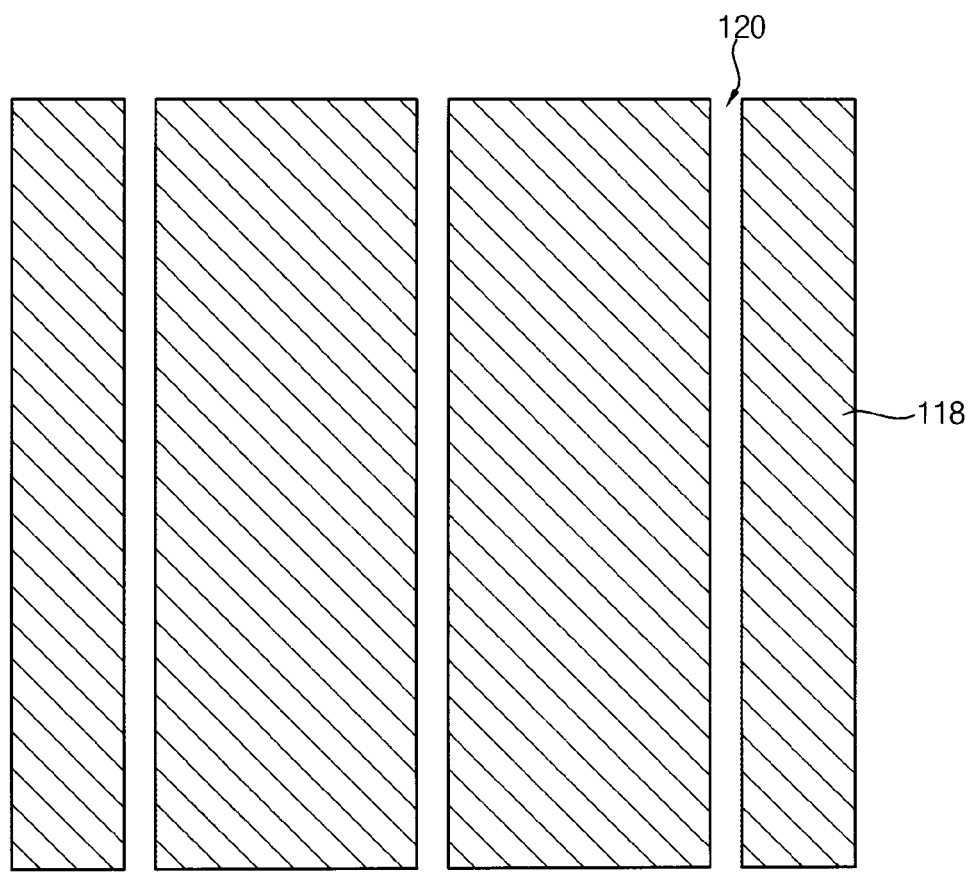

Referring to FIGS. 18 and 19, a third insulating interlayer 116 may be formed on the first gate pattern 114. A second gate layer may be formed on the third insulating interlayer 116.

The second gate layer may include a conductive material having a second work function lower than the first work function. In example embodiments, the second gate layer may be a polysilicon layer doped with N-type impurities.

Thereafter, the second gate layer may be patterned to form second gate patterns 118. Each of the second gate patterns 118 may have a line shape extending in the first direction. A second trench 120 extending in the first direction may be formed between the second gate patterns 118. As such, the second gate pattern 118 may be disposed to face the selection gate pattern 108a.

Figure 20:
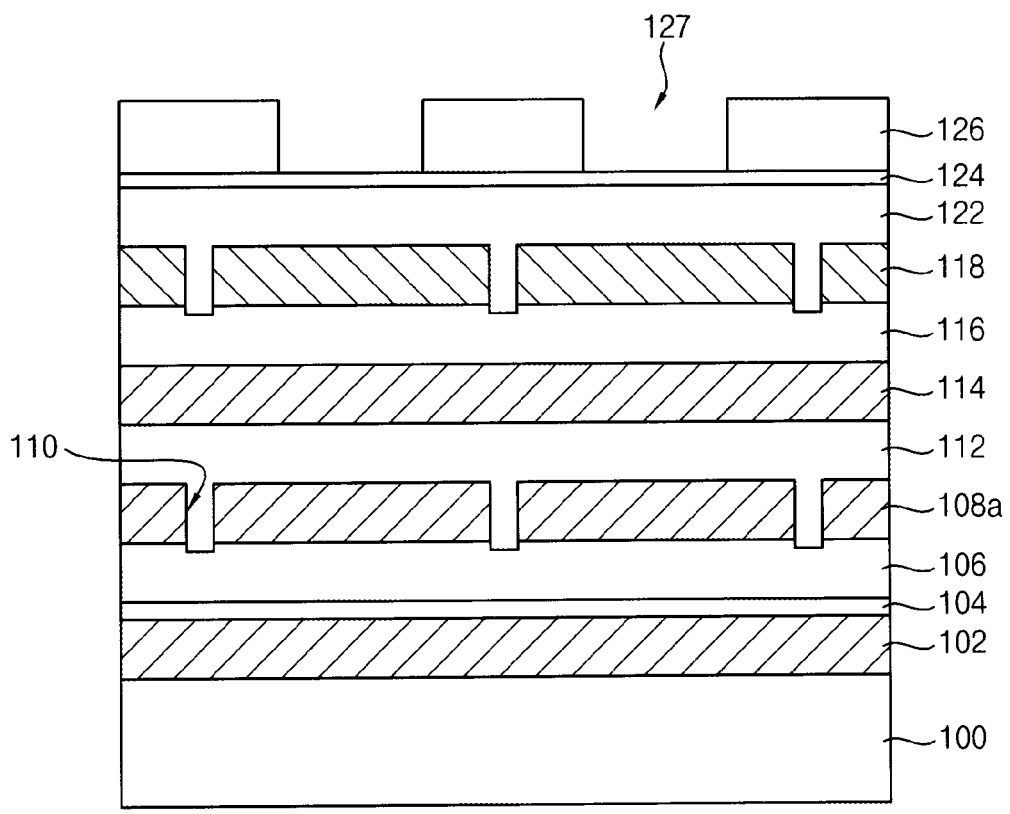
Figure 21:
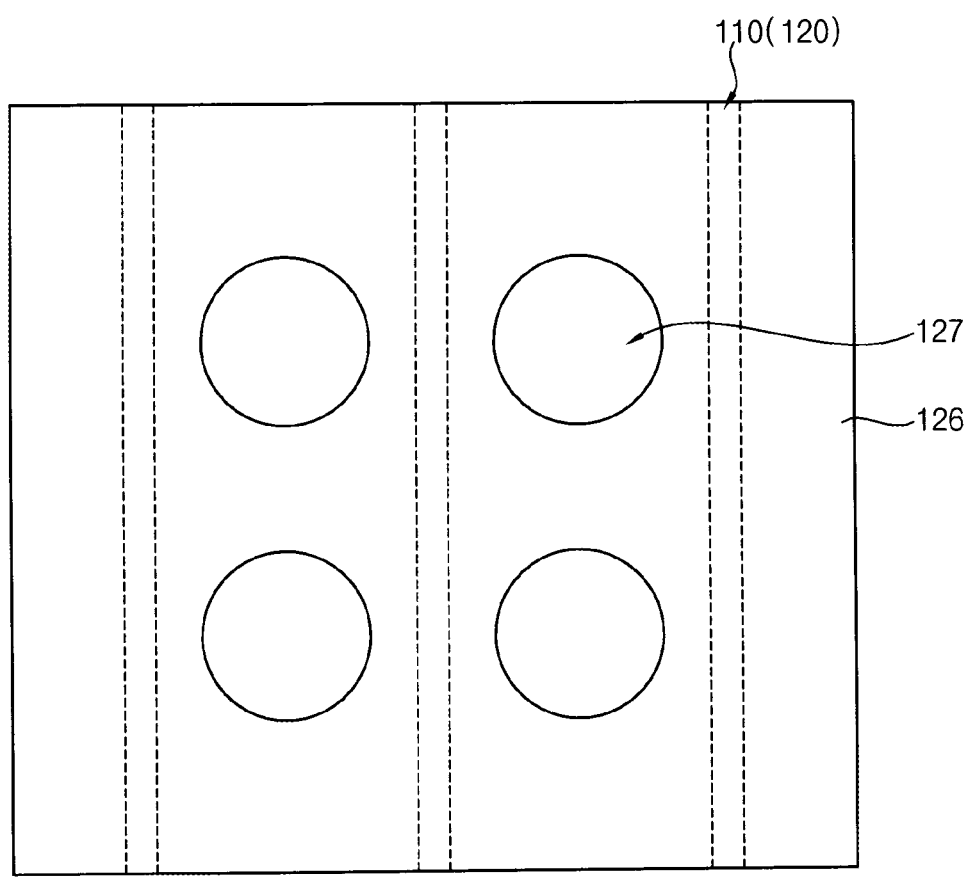

Referring to FIGS. 20 and 21, a fourth insulating interlayer 122 may be formed on the second gate patterns 118 to fill the second trench 120.

In example embodiments, an insulation layer may be formed to fill the second trench 120, and then the insulation layer may be planarized until an upper surface of the second gate pattern 118 may be exposed. Thereafter, an insulation layer may be further formed on the second gate patterns 118 and the insulation layer to form the fourth insulating interlayer 122. Therefore, an upper surface of the fourth insulating interlayer 122 may be flat.

A stop layer 124 may be formed on the fourth insulating interlayer 122. The stop layer 124 may include an insulation material having an etch selectivity with respect to silicon oxide. In example embodiments, the stop layer 124 may include silicon nitride. In some example embodiments, the stop layer may not be formed.

A hard mask layer may be formed on the stop layer 124, and the hard mask layer may be patterned to form a hard mask 126. In the patterning process for forming the hard mask, the stop layer 124 may be used as an etch stop layer. The hard mask 126 may include holes 127 exposing the stop layer 124 disposed on the second gate pattern 118 and the selection gate pattern 108a.

Figure 22:
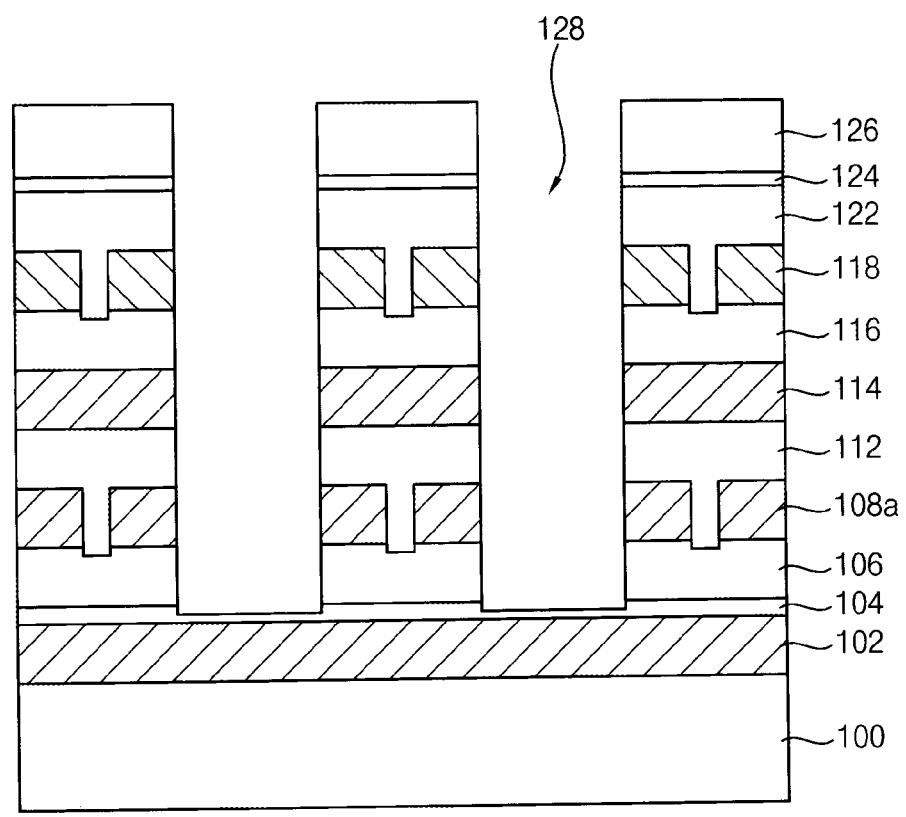

Referring to FIG. 22, the stop layer 124, the fourth insulating interlayer 122, the second gate pattern 118, the third insulating interlayer 116, the first gate pattern, the second insulating interlayer 112, the selection gate pattern 108a, and the first insulating interlayer 106 may be sequentially etched using the hard mask 126 as an etching mask to form a preliminary channel hole 128. In the etching process, the lower sacrificial layer 104 may be used as an etch stop layer. Thus, the lower sacrificial layer 104 may be exposed by a bottom of the preliminary channel hole 128.

Figure 23:
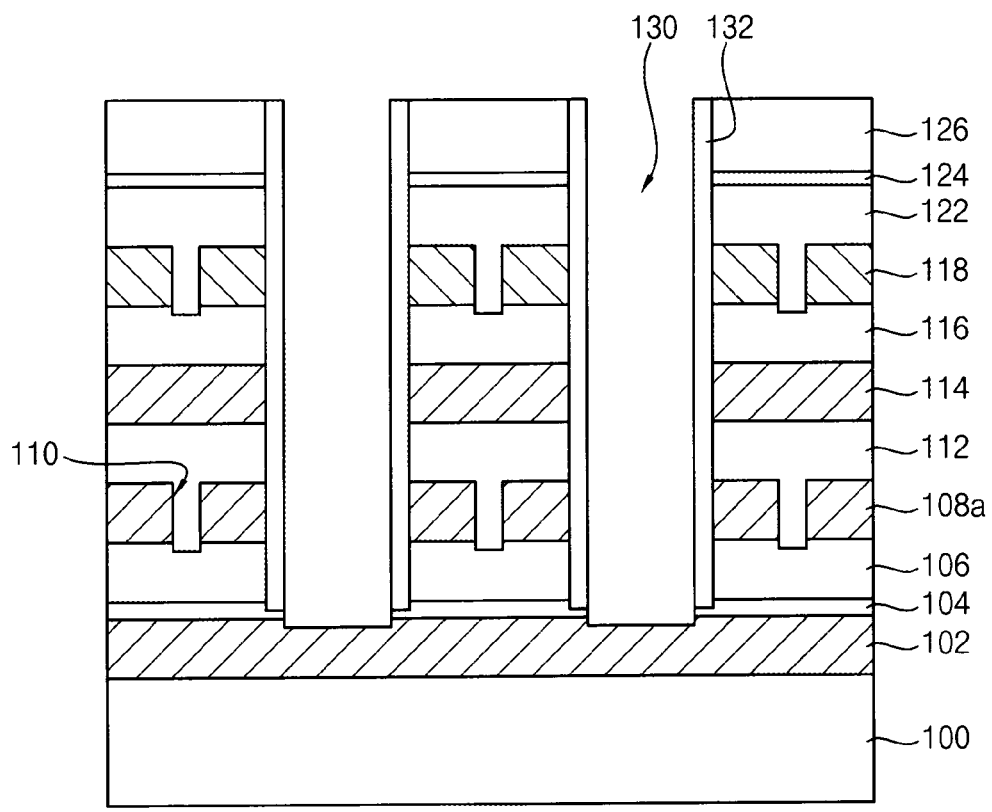

Referring to FIG. 23, a gate insulation layer may be conformally formed on a sidewall and bottom of the preliminary channel hole 128 and a surface of the hard mask 126. The gate insulation layer may be anisotropically etched, and then the lower sacrificial layer 104 may be etched to form a channel hole 130 exposing the common source region 102. A gate insulation layer pattern 132 may be formed on the sidewall of the channel hole 130.

The channel hole 130 may be formed to pass through the second gate pattern 118, the first gate pattern 114, and the selection gate pattern 108a.

Figure 24:
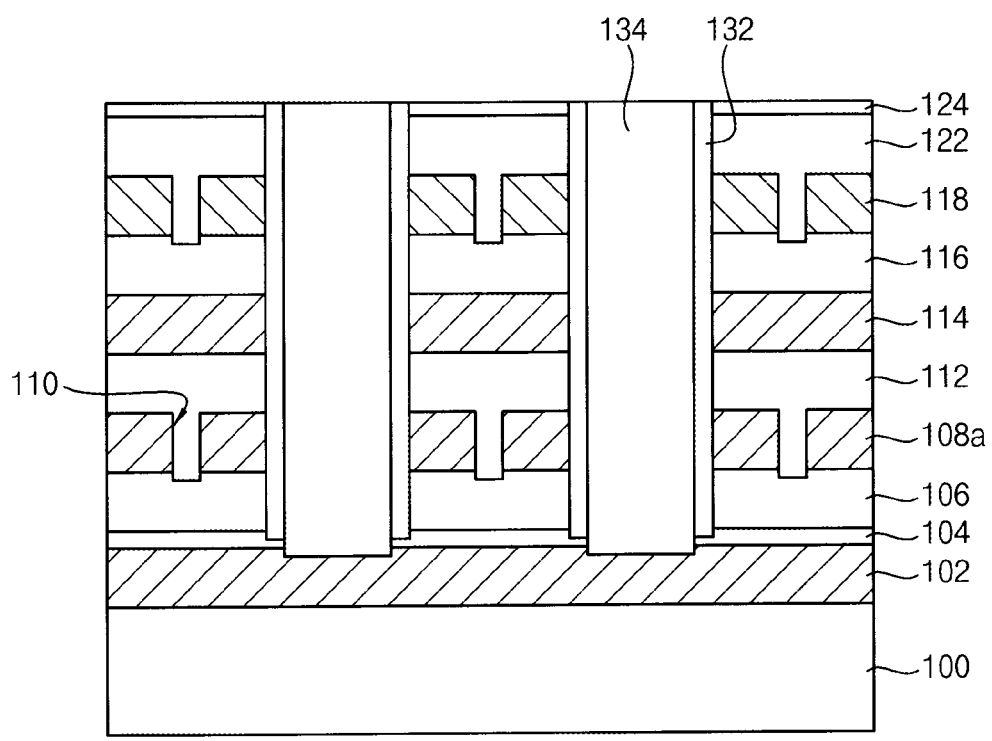
Figure 25:
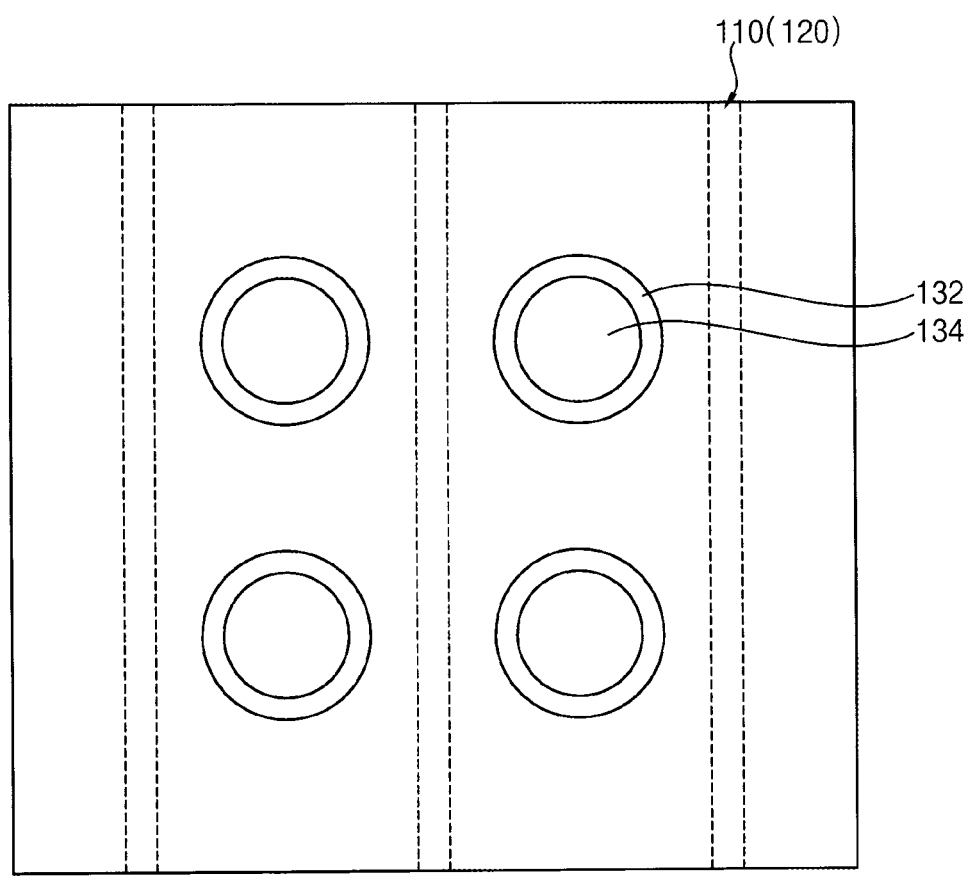

Referring to FIGS. 24 and 25, a channel layer may be formed on the gate insulation layer pattern 132, the hard mask 126, and the common source region 102 to sufficiently fill the channel hole 130. The channel layer may include, for example, a single crystalline semiconductor material or polysilicon.

In example embodiments, a process for forming the channel layer may include a selective epitaxial growth process using the substrate 100 as a seed. In this case, the channel layer may include, for example, a single crystalline semiconductor material. For example, the channel layer may include single crystalline silicon and silicon germanium. In some example embodiments, the channel layer may include MoS, graphene, or the like.

In some example embodiments, the channel layer may include a polysilicon formed by a chemical vapor deposition process.

Thereafter, the channel layer and the hard mask 126 may be planarized until an upper surface of the stop layer 124 may be exposed. In the planarization process, the hard mask 126 may be removed. Thus, a channel 134 may be formed in the channel hole 130.

Figure 26:
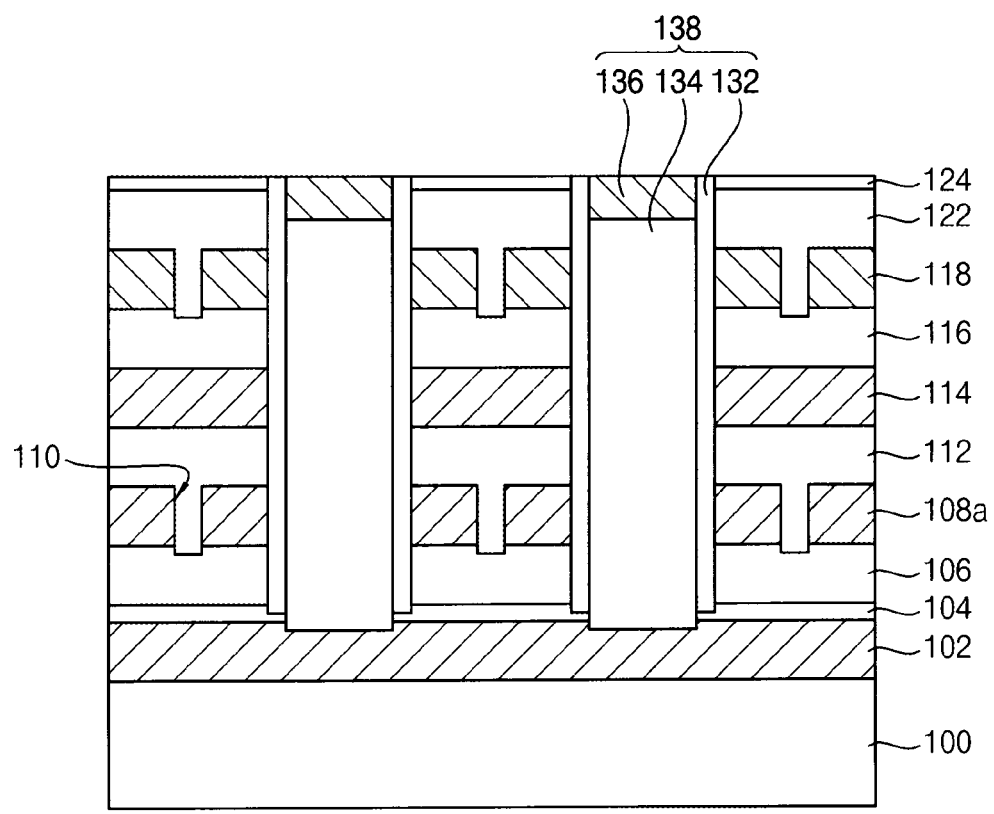
Figure 27:
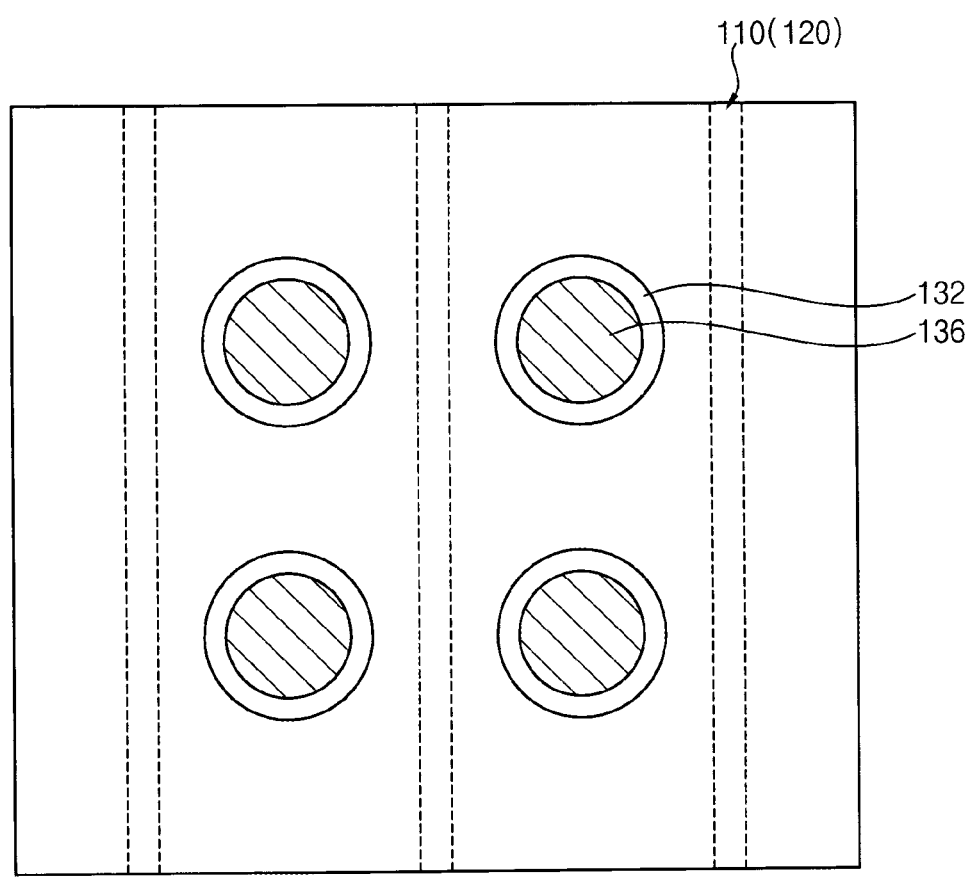
Figure 27:
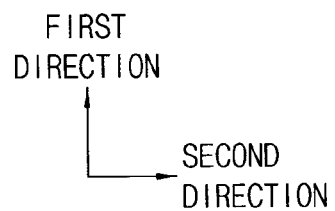

Referring to FIGS. 26 and 27, an upper portion of the channel 134 may be doped with impurities having the second conductivity type to form a drain region 136.

A bottom of the drain region 136 may be higher than a top surface of the second gate pattern 118.

In example embodiments, after the drain region 136 is formed, the stop layer 124 may be removed. In some example embodiments, the stop layer 124 may not be removed.

Therefore, a channel structure 138 may be formed in the channel hole 130. The channel structure 138 may include the channel 134, the gate insulation layer pattern 132 and the drain region 136.

Figure 28:
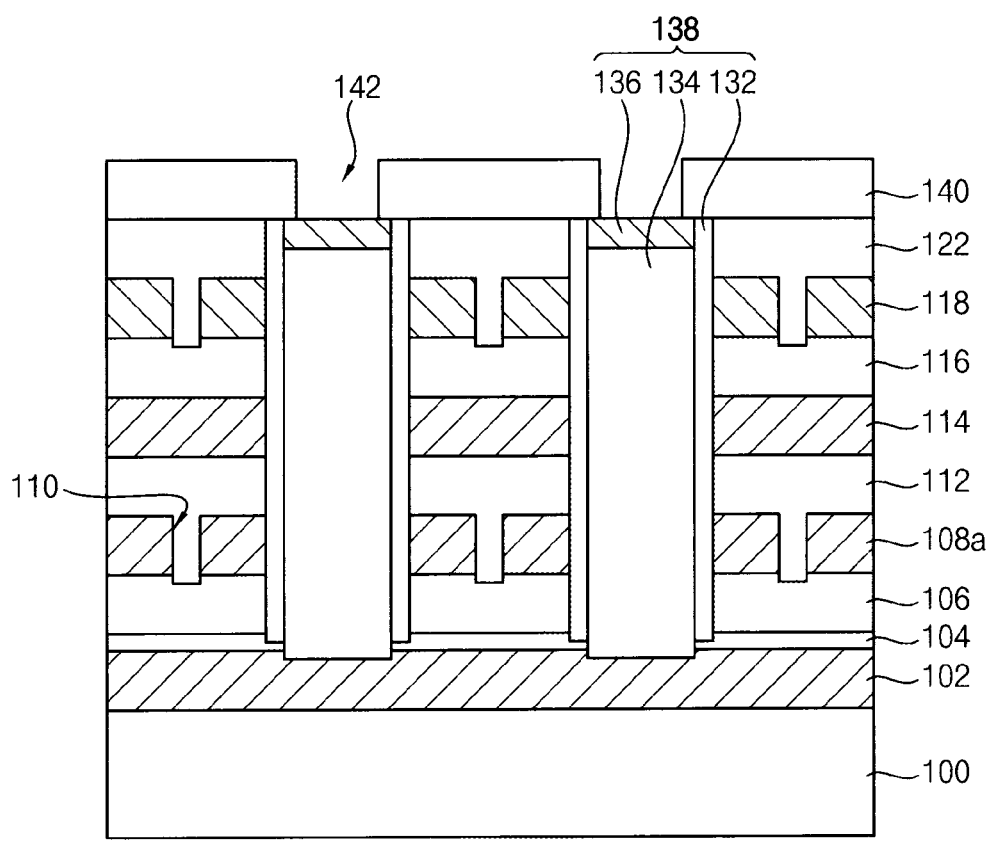
Figure 29:
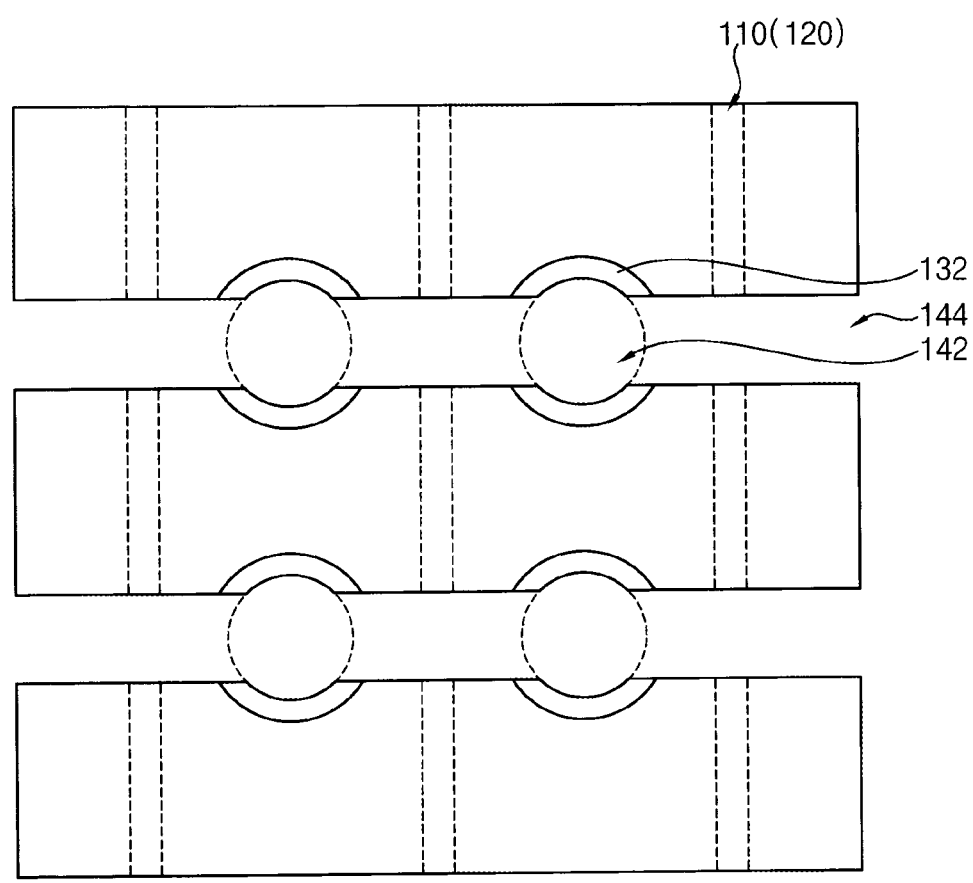

Referring to FIGS. 28 and 29, a fifth insulating interlayer 140 and a sixth insulating interlayer 156 (referred to FIG. 3) may be formed on the fourth insulating interlayer 122 and the channel structure 138.

The sixth insulating interlayer 156 may be etched to form a trench 144 extending in the second direction. Further, the fifth insulating interlayer 140 exposed by the bottom of the trench 144 may be etched to form a first contact hole 142 exposing an upper surface of the channel structure 138.

Referring to FIGS. 1 to 3 again, a conductive layer may be formed to fill the trench 144 and the first contact hole 142. The conductive layer may be planarized until an upper surface of the sixth insulating interlayer 156 may be exposed to form a bit line 152 filling the trench 144 and a bit line contact 150 filling the first contact hole 142.

The bit line 152 may extend in the second direction. Thus, the bit line 152 may intersect the selection gate pattern 108a and the second gate pattern 118.

As described above, the memory device may be manufactured. In the processes for manufacturing the memory device, the first gate pattern may not be patterned so that the processes may be simplified.

In example embodiments, each of the unit cells in the memory device may include the source region, the selection transistor, the first transistor, the second transistor, and the drain region. However, in some example embodiments, the elements included in the unit cell may be variously arranged in the vertical direction, while the first and second transistors may be disposed adjacent to each other.

Various examples of the arrangement of the elements included in the unit cell may be described with reference to a table 2. Each of the elements may be arranged at one of first level to fifth level from the substrate. That is, the memory device illustrated with reference to FIG. 1 may correspond to example 1 of the table 2. In the table 2, the selection transistor, a common gate, a gate having a line shape are referred to as a selection TR, a first gate, and a second gate, respectively.

TABLE 2

|  | first level | second level | third level | fourth level | fifth level |
|---|---|---|---|---|---|
| example 1 | source region | selection TR | first gate | second gate | drain region |
| example 2 | source region | first gate | second gate | selection TR | drain region |
| example 3 | source region | selection TR | second gate | first gate | drain region |
| example 4 | source region | second gate | first gate | selection TR | drain region |
| example 5 | drain region | selection TR | first gate | second gate | source region |
| example 6 | drain region | first gate | second gate | selection TR | source region |

TABLE 2-continued

|  | first level | second level | third level | fourth level | fifth level |
|---|---|---|---|---|---|
| example 7 | drain region | selection TR | second gate | first gate | source region |
| example 8 | drain region | second gate | first gate | selection TR | source region |

In examples 1 to 4, the source region may be formed at the substrate. In examples 1 to 4, the source region may be formed at an entire upper portion of the substrate, or each of the source regions may have a line shape extending in the second direction.

In examples 5 to 8, the drain region may be formed at the substrate. In examples 5 to 8, the drain region may be formed at an entire upper portion of the substrate, or each of the drain regions may have a line shape extending in the second direction.

In some example embodiment, each of the unit cells cell may include two selection transistors. That is, each of the unit cells may include the source region, a lower selection transistor, the first transistor, the second transistor, an upper selection transistor, and the drain region. In each of examples of table 2, the upper selection transistor may be further formed between the fourth level and fifth level.

Figure 30A:
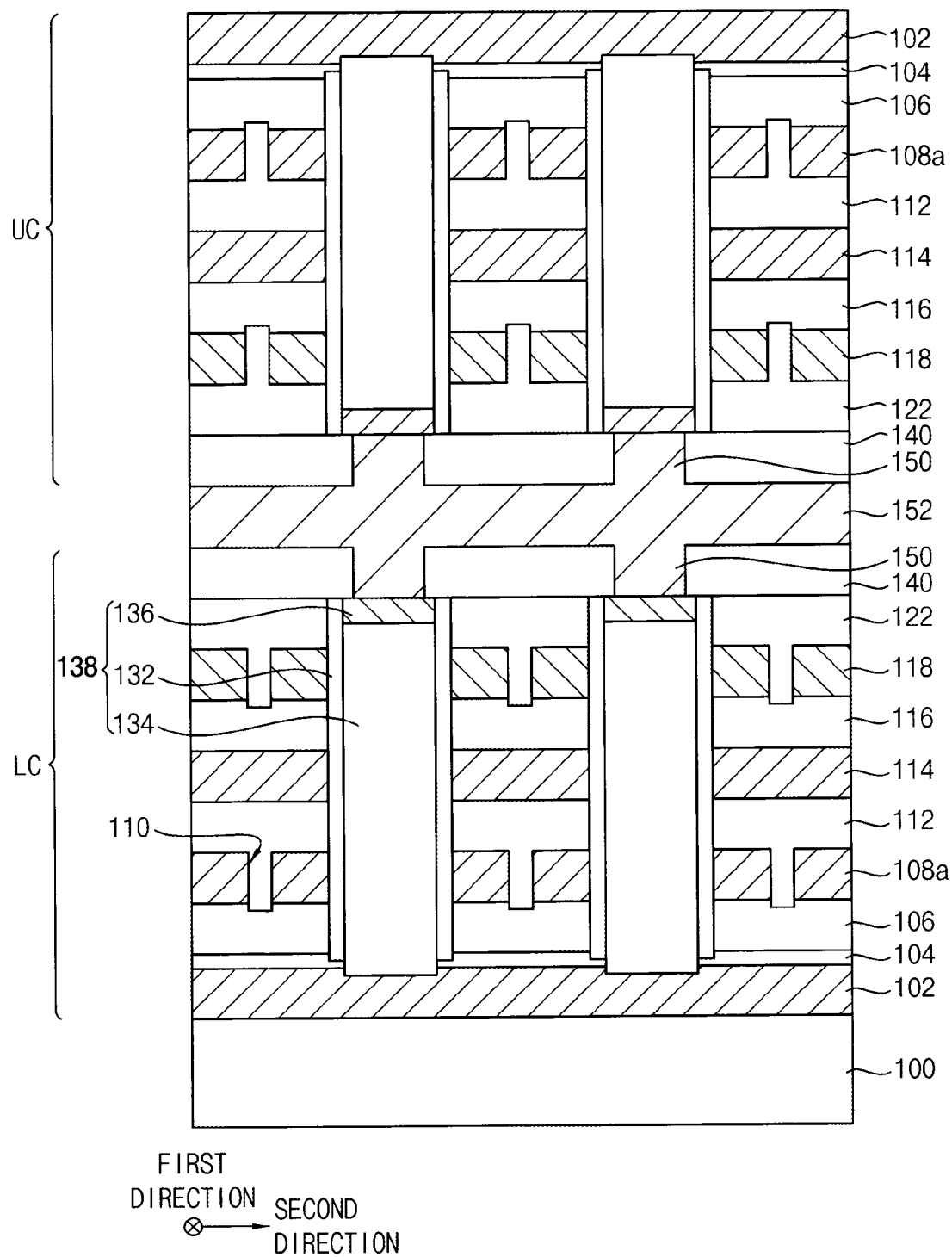
FIG. 30A is a cross-sectional view illustrating a stacked memory device in accordance with example embodiments of the present inventive concept.
Figure 30B:
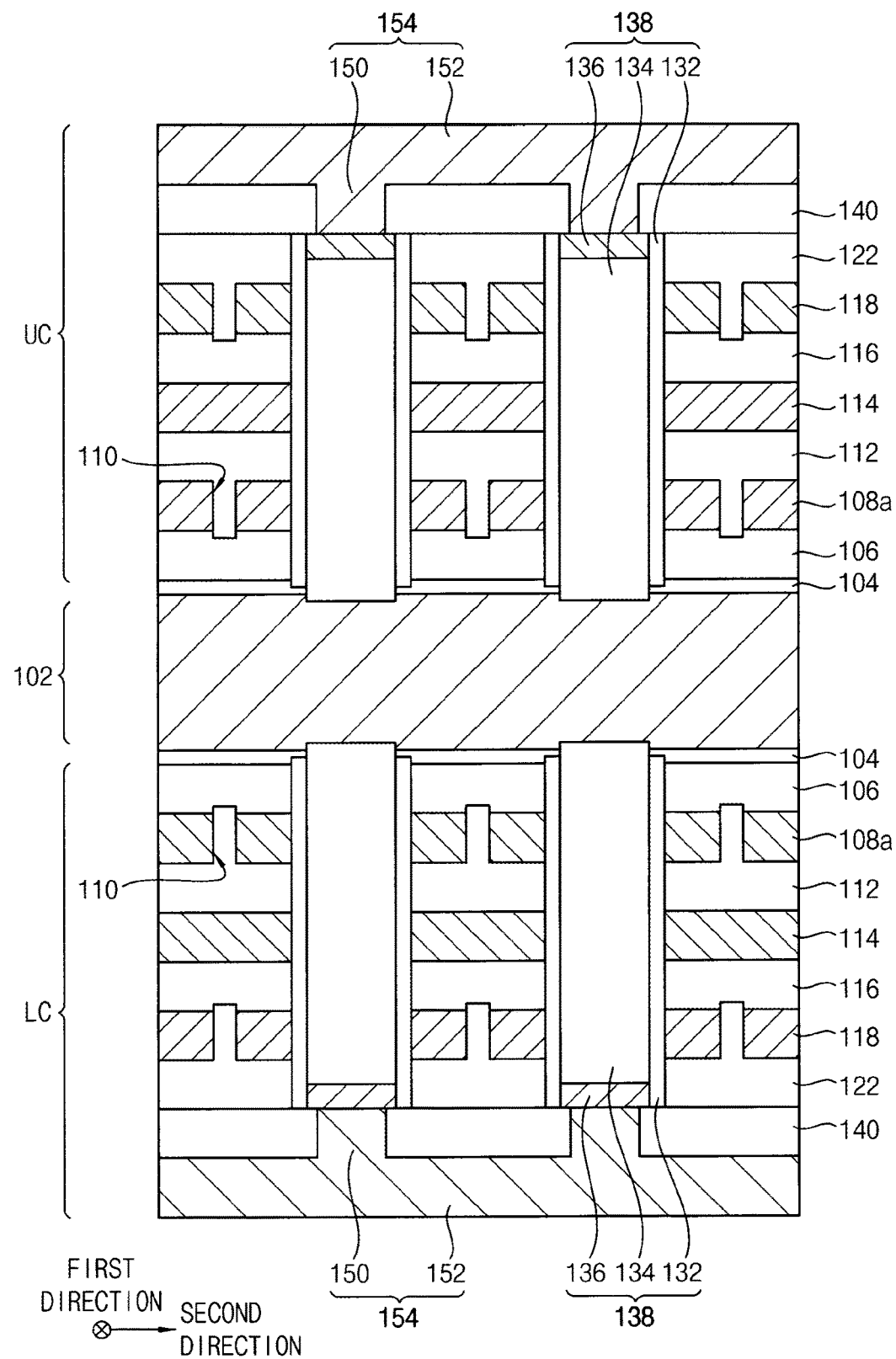
FIG. 30B is a cross-sectional view illustrating a stacked memory device in accordance with example embodiments of the present inventive concept.

FIG. 30A is a cross-sectional view illustrating a stacked memory device in accordance with example embodiments of the present inventive concept. FIG. 30B is a cross-sectional view illustrating a stacked memory device in accordance with example embodiments of the present inventive concept.

As shown in FIGS. 30A and 30B, the memory device may further include memory cells stacked in a vertical direction.

Referring to FIG. 30A, in the memory device, a bit line 152 may be formed between a lower cell LC and an upper cell UC thereover, and the bit line 152 may be commonly used in the lower cell LC and the upper cell UC. In this case, the lower cell LC and the upper cell UC may be symmetric with respect to the bit line 152.

Referring to FIG. 30B, in the memory cell, a common source region 102 may be formed between the lower cell LC and the upper cell UC thereover. In this case, the lower cell LC and the upper cell UC may be symmetric with respect to the common source region 102.

FIGS. 31 to 35 are cross-sectional views illustrating a method of manufacturing a memory device in accordance with example embodiments of the present inventive concept.

A memory cell of the memory device may be substantially the same as the memory cell of the memory device illustrated with reference to FIG. 1, except that the selection gate pattern may be formed of metal.

Figure 31:
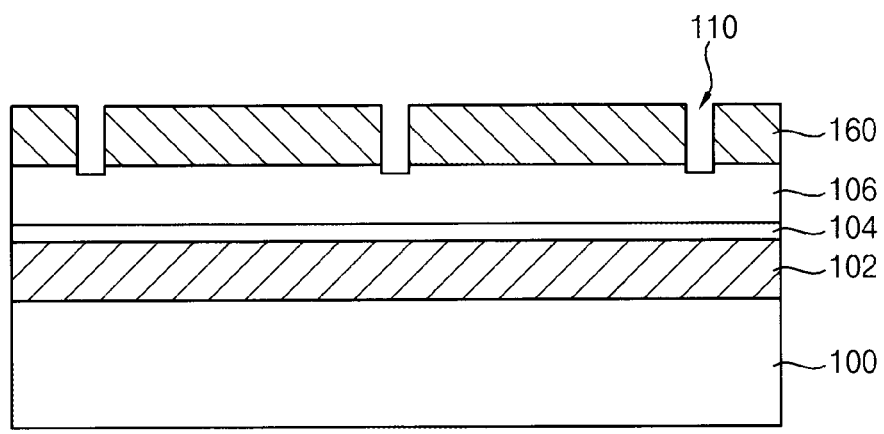
Figure 32:
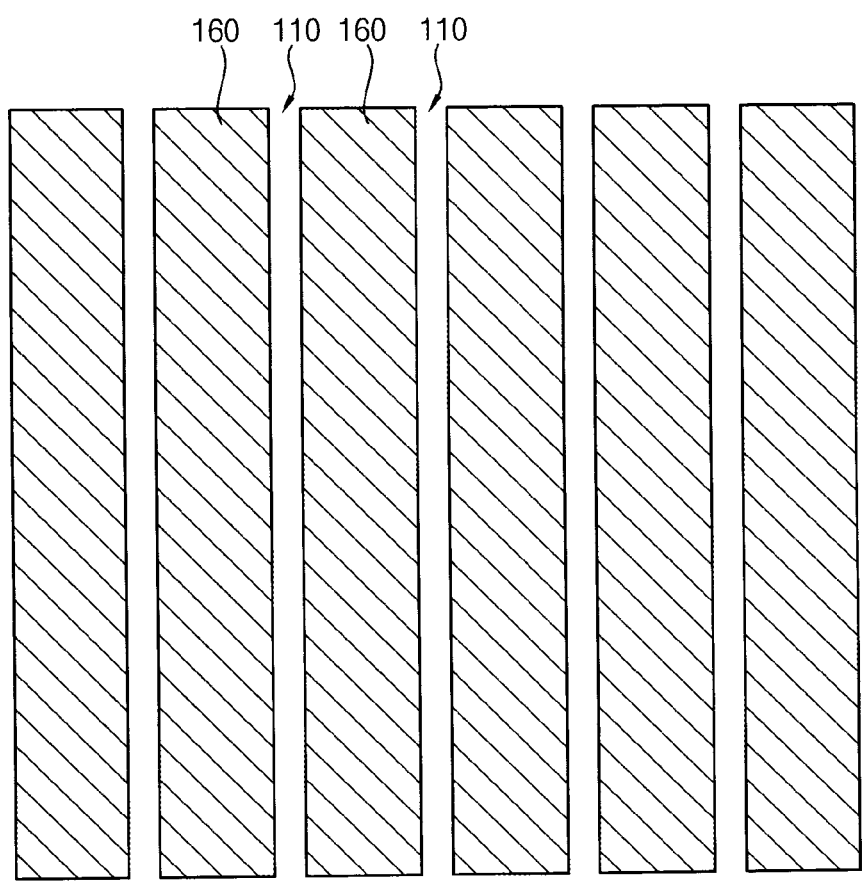
Figure 32:
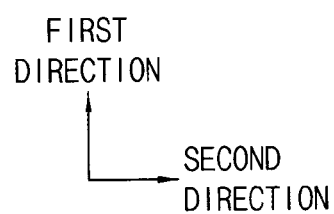

Referring to FIGS. 31 and 32, first, the same processes as illustrated with reference to FIGS. 10 and 11 may be performed. Thereafter, the first insulating interlayer 106 may be formed on the lower sacrificial layer 104. A first sacrificial layer may be formed on the first insulating interlayer 106.

The first sacrificial layer may include a material having an etch selectivity with respect to the lower sacrificial layer 104 and the first and second gate layers subsequently formed.

For example, when the lower sacrificial layer 104 includes aluminum oxide, the first sacrificial layer may include silicon nitride. For example, the lower sacrificial layer 104 may not be formed.

The first sacrificial layer may be patterned to form first sacrificial patterns 160. Each of the first sacrificial patterns 160 may have a line shape extending in the first direction. A first trench 110 extending in the first direction may be formed between the first sacrificial patterns 160.

Subsequently, the same process as illustrated with reference to FIGS. 12 to 27 may be performed. Thereafter, a fifth insulating interlayer 140 may be formed on the fourth insulating interlayer 122 and the channel structure 138.

Figure 33:
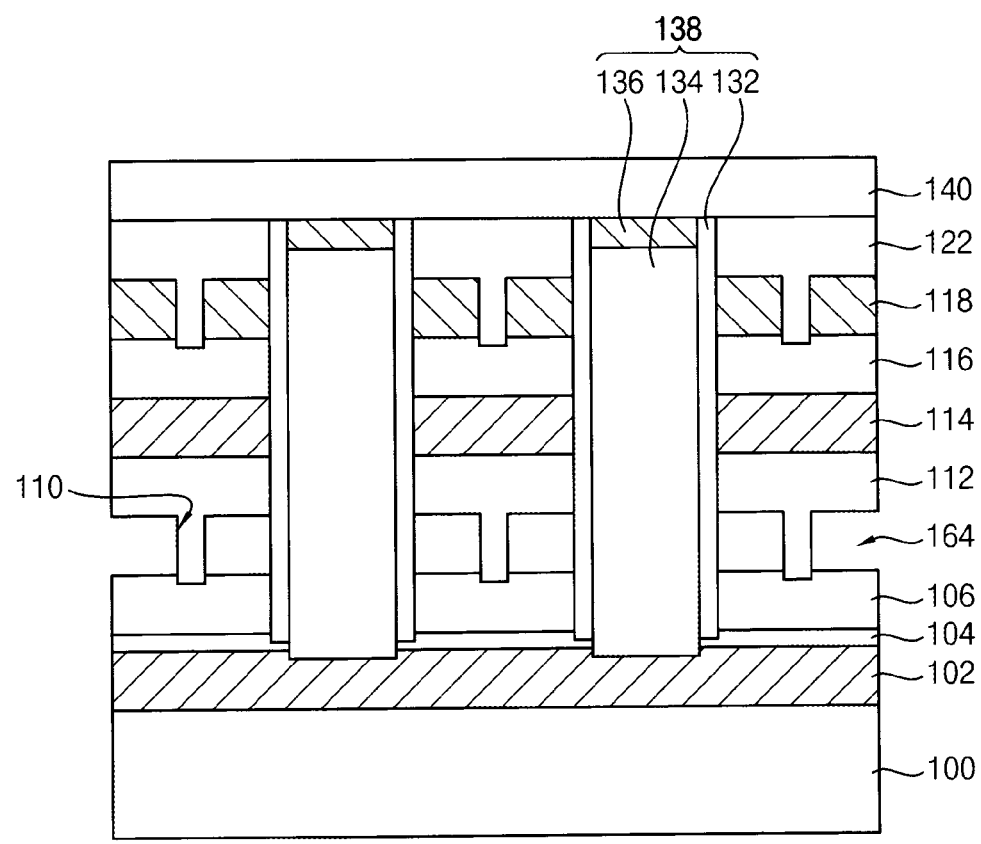
Figure 34:
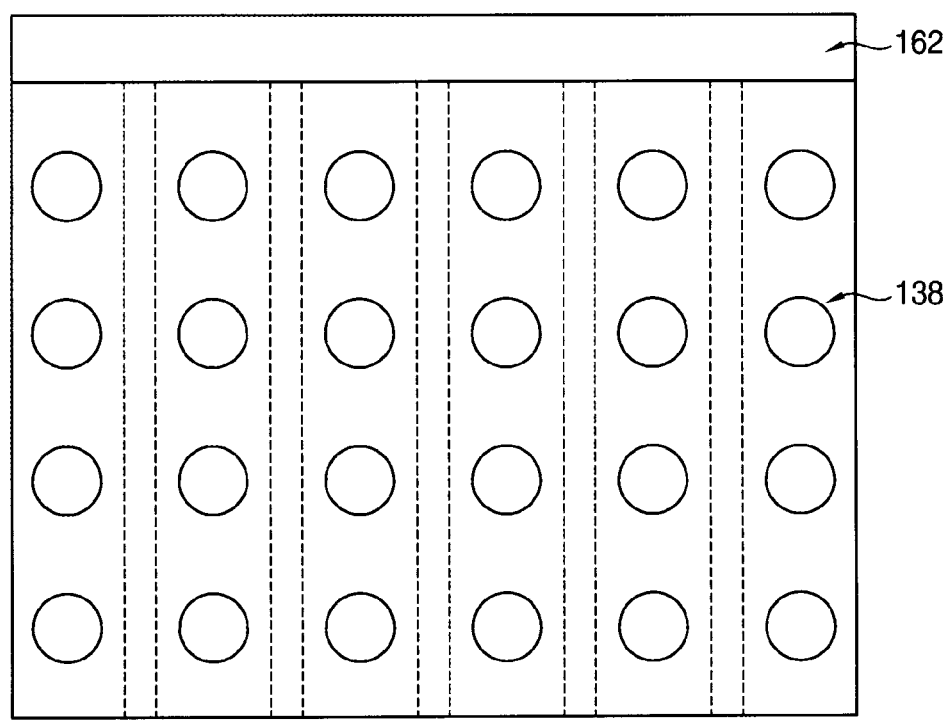
Figure 34:
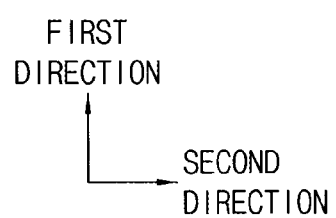

Referring to FIGS. 33 and 34, an etching process may be performed to replace the first sacrificial patterns with a metal material by a replacement process.

Particularly, the fifth insulating interlayer 140, the fourth insulating interlayer 122, the second gate pattern 118, the third insulating interlayer 116, the first gate pattern 114, the second insulating interlayer 112, the first sacrificial pattern 160 and the first insulating interlayer 106 may be sequentially etched to form a trench 162 extending in the second direction. For example, the trench 162 may be formed at a boundary of cell blocks.

The first sacrificial pattern 160 exposed by the sidewall of the trench 162 may be removed to form a gap 164. As the trench 162 extends in the second direction, all of the first sacrificial patterns 160 may be removed along the second direction.

Figure 35:
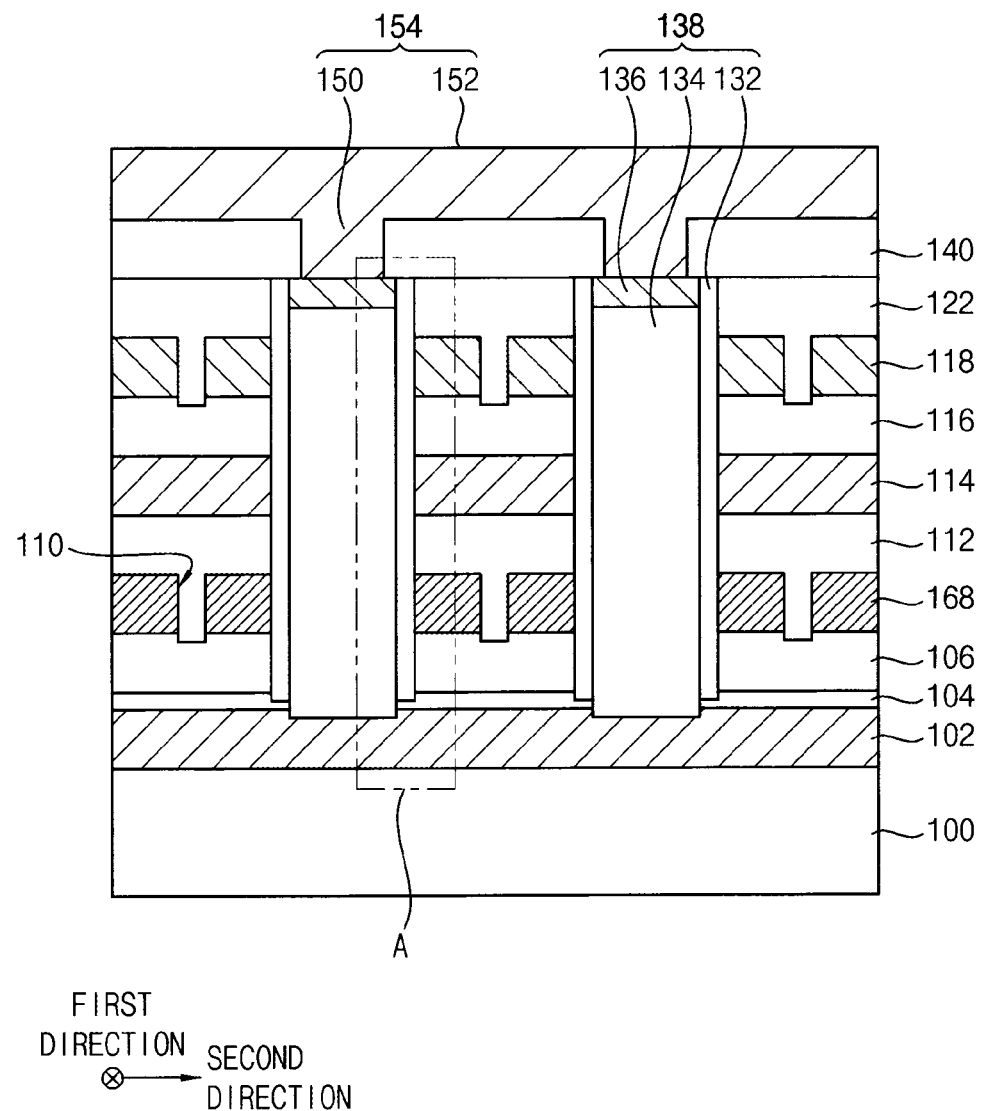

Referring to FIG. 35, a metal material may be formed to sufficiently fill the gap 164. In example embodiments, a barrier metal layer may be conformally formed on a surface of the gap 164, and a metal layer may be formed on the barrier metal layer to fill the gap 164. The barrier metal layer may include, e.g., titanium, titanium nitride, tantalum, and tantalum nitride, etc. The metal layer may include, e.g., tungsten.

Thereafter, the metal material filling the trench (162, referred to as FIG. 34) may be selectively removed to form a selection gate pattern 168 filling the gap 164. Further, an insulation material (not shown) may be formed to fill the trench 162.

As described above, the memory device may include the selection gate pattern including a metal material having a resistance lower than that of polysilicon.

Figure 36:
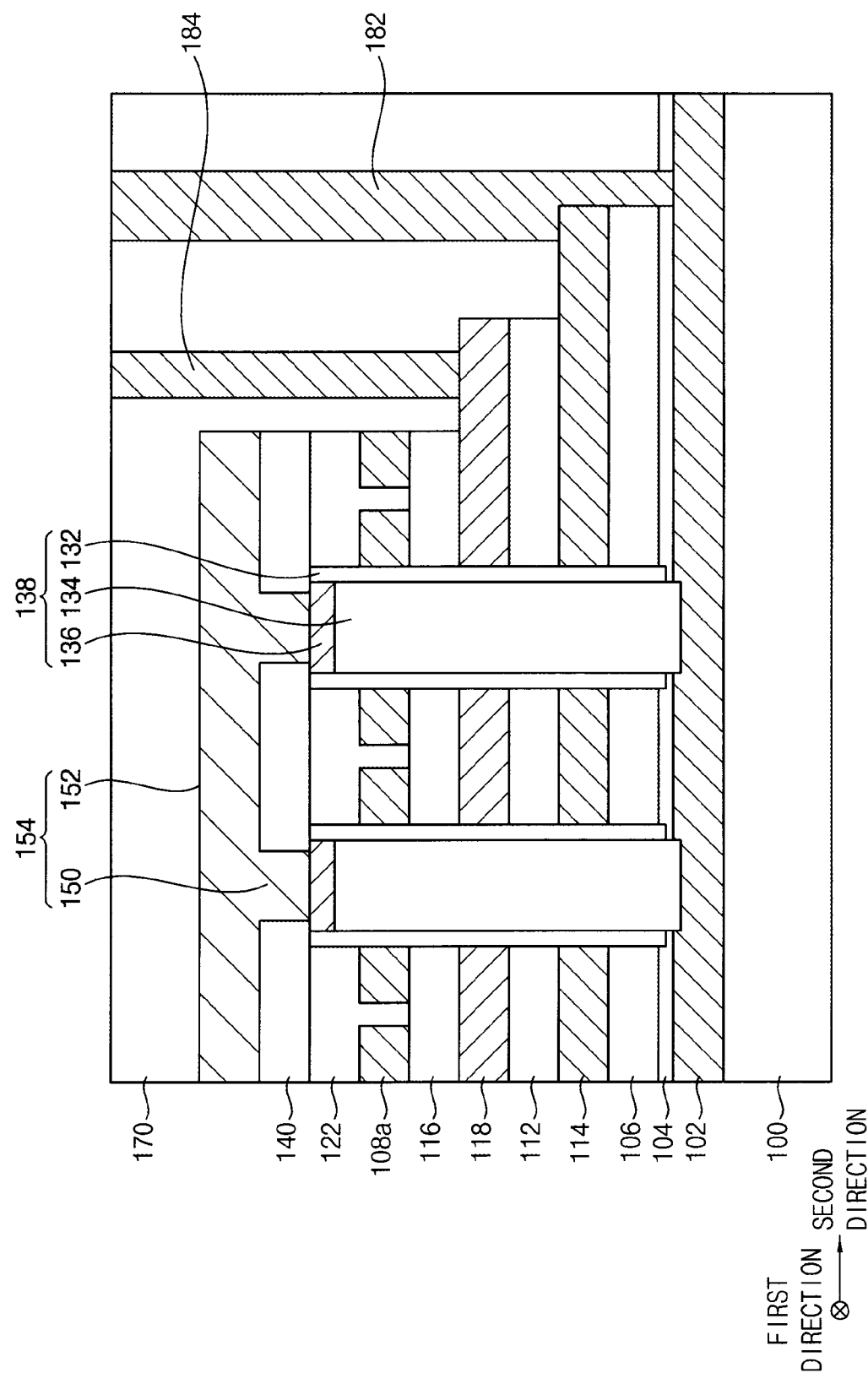
Figure 37:
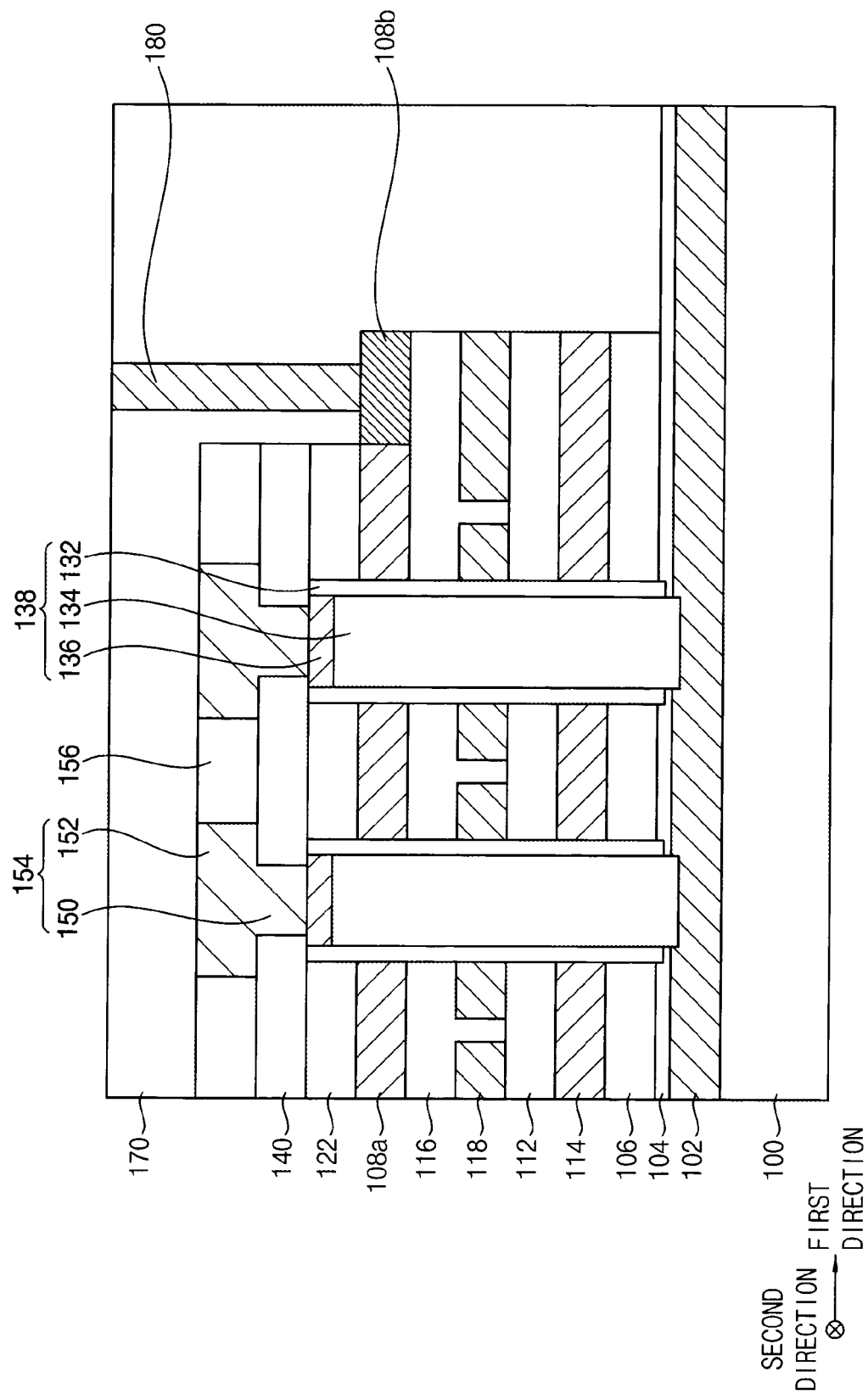
Figure 38:
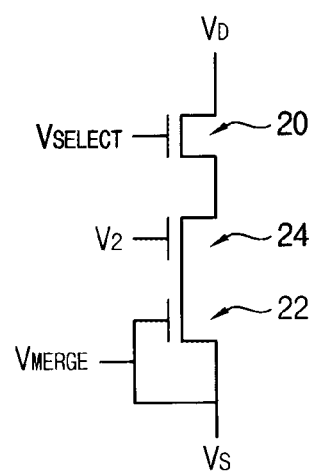

FIGS. 36 and 37 are cross-sectional views illustrating a memory device in accordance with example embodiments of the present inventive concept. FIG. 38 is a circuit diagram of a unit memory cell in a memory device in accordance with example embodiments of the present inventive concept.

FIG. 36 is a cross-sectional view of the memory device cut in the second direction, and FIG. 37 is a cross-sectional view of the memory device cut in the first direction.

Hereinafter, each of elements included in the memory device illustrated in FIGS. 36 to 38 may be substantially the same as each of elements included in the memory device illustrated in FIGS. 1 to 3, respectively. That is, the unit cell of the memory device may include the source region, the selection transistor, the first transistor, the second transistor, and the drain region.

However, in the memory device, the first gate pattern 114 may be electrically connected to the common source region 102. In example embodiments, the second gate pattern 118 and the selection gate pattern 108a may extend to be perpendicular to each other, and the bit line may extend in a direction the same as an extending direction of the second gate pattern. That is, the selection gate pattern 108a may extend in the first direction, and the second gate pattern 118 and bit line 152 may extend in the second direction. An upper wiring may be electrically connected to each of the unit cells.

Referring to FIGS. 36 to 38, each of the unit cells in the memory device may include the channel structure 138 formed on the substrate 100, and the first gate pattern 114, the second gate pattern 118 and the selection gate pattern 108a formed on a sidewall of the channel structure 138. The first gate pattern 114, the second gate pattern 118 and the selection gate pattern 108a may be spaced apart from each other in the vertical direction. Further, the common source region 102 may be formed at an upper portion of the substrate 100. The bit line structure 154 may be formed on the channel structure 138, and the bit line structure 154 may be electrically connected to the channel structure 138. In addition, similar to that shown in FIG. 1, the memory device may include the first to sixth insulating interlayers 106, 112, 116, 122, 140, and 156.

An upper insulating interlayer 170 may cover the bit line structure 154 and structures formed under the bit line structure 154.

In example embodiments, in the unit cell of the memory device, the first gate pattern 114 may be formed at a lowermost level, and the selection gate pattern 108a may be formed at an uppermost level.

A cell region of the substrate 100 may include cell block regions having a square shape.

In the cell block region, the selection gate pattern 108a may extend in the first direction. The first gate pattern 114 may not be patterned, so that the first gate pattern 114 may have a shape of wide one pattern. The second gate pattern 118 may extend in the second direction. Also, the bit line 152 included in the bit line structure 154 may extend in the second direction.

In example embodiments, edge portions in the first direction of the selection gate pattern 108a may include metal patterns, respectively. A polysilicon pattern may be formed between the metal patterns. That is, as the metal patterns 108b having a low resistance may include at the edge portions of the selection gate pattern 108a, a resistance of the selection gate pattern 108a may be decreased.

A first contact plug 180 may be electrically connected to each of the selection gate patterns 108a. The first contact plug 180 may contact an upper surface of the selection gate pattern 108a positioned at edge portions in the first direction of the cell block region. The first contact plug 180 may extend to the upper surface of the selection gate pattern 108a through the upper insulating interlayer 170. In example embodiments, the first contact plug 180 may contact an upper surface of the metal pattern 108b in the selection gate pattern 108a. The first contact plug 180 may be electrically insulated from the bit line 152 and the first and second gate patterns 114 and 118.

In example embodiments, edge portions in the second direction of the first gate pattern 114 and the second gate pattern 118 may have a step shape.

A second contact plug 182 may be electrically connected to the first gate pattern 114 and the common source region 102. The second contact plug 182 may contact the edge portion in the second direction of the first gate pattern 114, and may extend to the common source region 102.

In example embodiments, the second contact plug 182 may pass through the upper insulating interlayer 170, and may contact a surface of the first gate pattern 114 and an upper surface of the common source region 102. For example, the second contact plug 182 may contact a sidewall and an upper surface of the first gate pattern 114, and may extend to the common source region 102. For example, the second contact plug 182 may pass through the first gate pattern 114, and may contact the first gate pattern 114 and the common source region 102. In this case, the second contact plug 182 may be electrically insulated from the bit line 152, the second gate pattern 118, and the selection gate pattern 108a.

A third contact plug 184 may be electrically connected to the second gate pattern 118. The third contact plug 184 may contact an upper surface of the second gate pattern 118 positioned at an edge portion in the second direction of the cell block region. The third contact plug 184 may pass through the upper insulating interlayer 170, and may extend to the upper surface of the second gate pattern 118. The third contact plug 184 may be electrically insulated from the bit line 152, the first gate pattern 114, and the selection gate pattern 108a.

As described above, the first gate pattern 114 and the common source region 102 may be electrically connected to each other. Thus, a wiring may be simplified.

In this case, an electronic energy barrier of the first transistor 22 may be controlled to be high. Thus, the memory cell may be operated, even though the same voltage is applied to the first gate pattern 114 and the common source region 102.

For example, a work function of the first gate pattern 114 may be controlled to be high. That is, the work function of the first gate pattern 114 may be controlled by materials, doping of impurities, etc. For example, the electronic energy barrier of the first transistor may be controlled by a work function of a channel 134 of the first transistor 22 or fixed charges positioned at a gate insulation layer pattern 132 or a channel of the first transistor 22.

Figure 39:
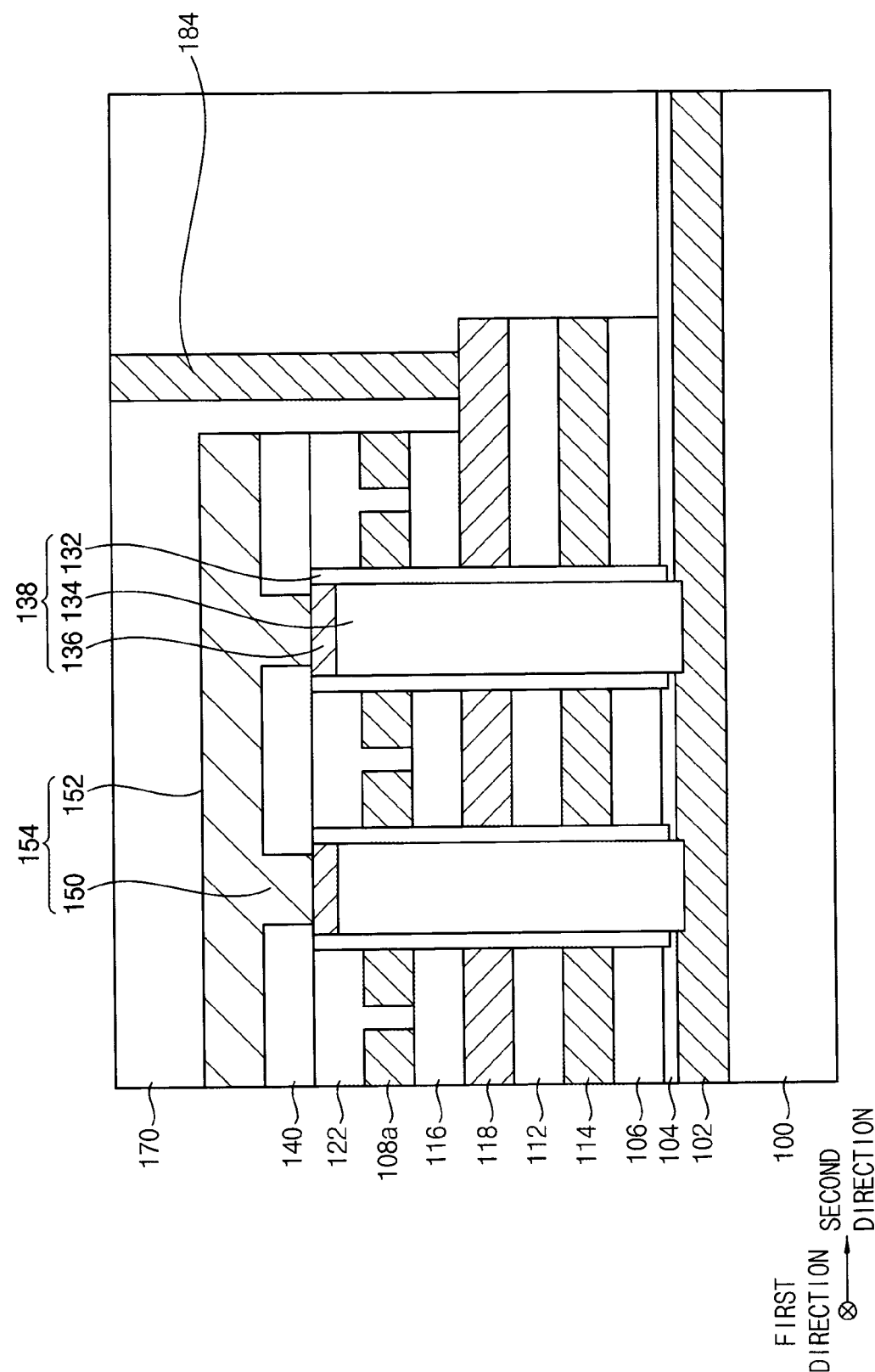
Figure 40:
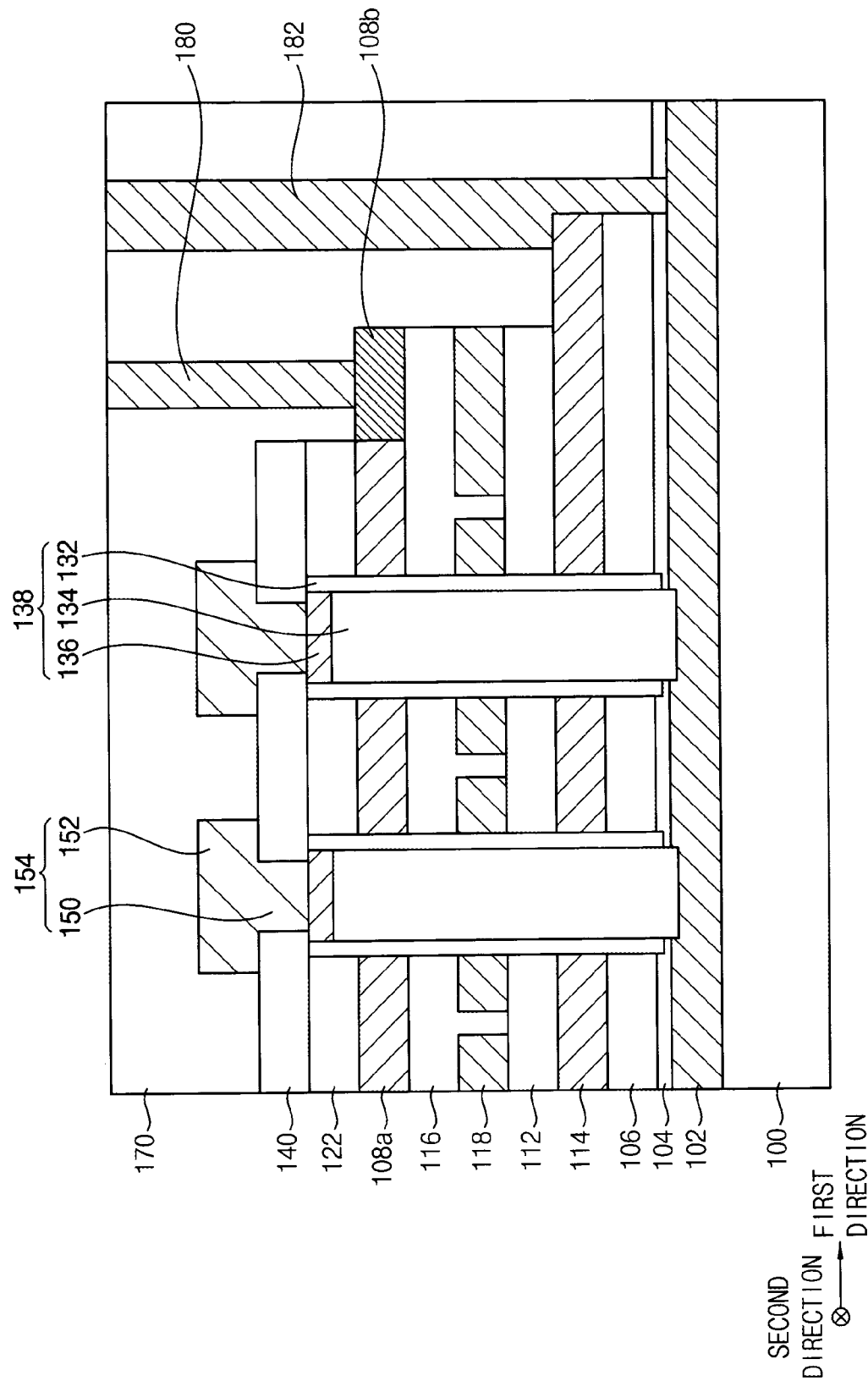

FIGS. 39 and 40 are cross-sectional views illustrating a memory device in accordance with example embodiments of the present inventive concept.

FIG. 39 is a cross-sectional view of the memory device cut in the second direction. FIG. 40 is a cross-sectional view of the memory device cut in the first direction.

The memory device shown in FIGS. 39 and 40 may be substantially the same as the vertical semiconductor device shown in FIGS. 36 and 37, except for a contact plug connected to each of the unit cells.

Referring to FIGS. 39 and 40, each of the unit cells in the memory device may include the first transistor 22, the second transistor 24, and the selection transistor 20 sequentially stacked on the substrate.

In example embodiments, edge portions in the first direction of the first gate pattern 114 and the selection gate pattern 108a may have a step shape.

A second contact plug 182 may be electrically connected to the first gate pattern 114 and the common source region 102. The second contact plug 182 may be formed on the edge portion in the first direction of the first gate pattern 114.

A third contact plug 184 may be electrically connected to the second gate pattern 118. The third contact plug 184 may contact an upper surface of at an edge portion in the second direction of the second gate pattern 118.

A first contact plug 180 may be electrically connected to each of the selection gate patterns 108a. The first contact plug 180 may contact an upper surface of the selection gate pattern 108a positioned at an edge portion in the first direction of the cell block region.

As described above, each of the unit cells of the memory device may include the source region, the selection transistor, the first transistor, the second transistor, and the drain region. In some example embodiments, in each of elements included in the unit cell, at least two of electrodes beside of the selection gate pattern of the selection transistor may be electrically connected to each other, and may be used in common.

Various examples of a connection between the electrodes included in the unit cell may be described with reference to circuit diagrams.

FIGS. 41 to 45 are circuit diagrams for illustrating memory devices in accordance with example embodiments of the present inventive concept, respectively.

Figure 41:
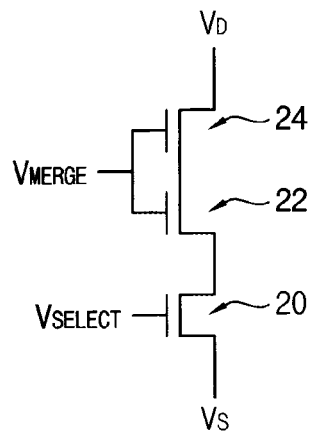
Figure 42:
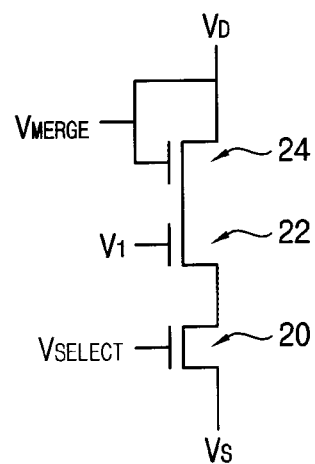
Figure 43:
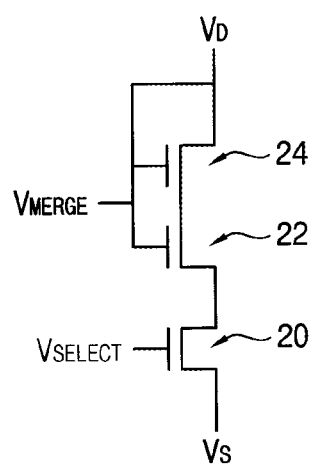

Each of the unit cells in the memory device illustrated in FIGS. 41 to 43 may have the selection transistor 20, the first transistor 22, and the second transistor 24 sequentially stacked from the substrate.

Referring to FIG. 41, the first gate pattern and the second gate pattern may be electrically connected to each other, and may be used as a common electrode. In this case, a work function difference between the first gate pattern and the second gate pattern may be controlled to be increased. Thus, a sufficient high energy barrier may be generated, even though the same voltage is applied to the first and second gate patterns.

Referring to FIG. 42, the second gate pattern may be electrically connected to the drain region. That is, the second gate pattern and the bit line may be electrically connected to each other, and may be used as a common electrode.

Referring to FIG. 43, the first gate pattern, the second gate pattern, and the drain region may be electrically connected to each other, and may be used as a common electrode.

Figure 44:
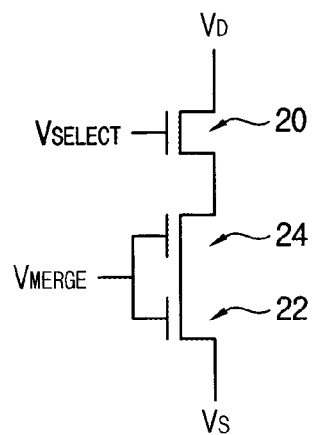
Figure 45:
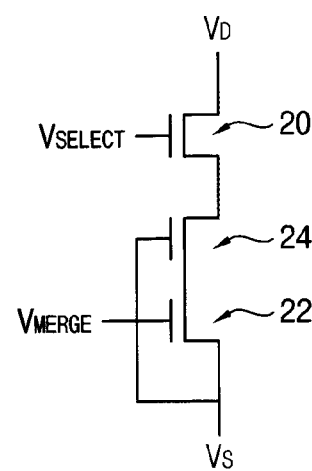

Each of the unit cells in the memory device illustrated in FIGS. 44 and 45 may have the first transistor 22, the second transistor 24, and the selection transistor 20 sequentially stacked from the substrate.

Referring to FIG. 44, the first gate pattern and the second gate pattern may be electrically connected to each other, and may be used as a common electrode.

Referring to FIG. 45, the first gate pattern, the second gate pattern, and the source region may be electrically connected to each other, and may be used as a common electrode.

As described above, in each of elements included in the unit cell, at least two of electrodes beside of the selection gate pattern of the selection transistor may be electrically connected to each other, and may be used in common. Thus, a wiring may be simplified.

The foregoing is illustrative of example embodiments and should not be construed as limiting the present inventive concept. Although some example embodiments have been described, those skilled in the art will readily appreciate that many modifications are possible in the example embodiments without materially departing from the scope of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory device, comprising:
    a source region including first impurities having a first conductivity type at an upper portion of a substrate;
    a plurality of channels contacting the source region, each of the plurality of channels extending in a vertical direction that is perpendicular to an upper surface of the substrate, and the plurality of channels comprising a first channel and a second channel;
    a gate insulation layer pattern covering a portion of the first channel;
    a selection gate pattern on the gate insulation layer pattern, the selection gate pattern extending in a first direction that is parallel to the upper surface of the substrate;
    a first gate pattern on the gate insulation layer pattern;
    a second gate pattern on the gate insulation layer pattern, the second gate pattern extending in parallel to the selection gate pattern; and
    a drain region including second impurities having a second conductivity type that is different from the first conductivity type at an upper portion of the first channel,
    wherein the selection gate pattern, the first gate pattern, and the second gate pattern are spaced apart from each other in the vertical direction, and
    wherein at least one of the source region and the first gate pattern has a plate shape and is a common electrode of the first channel and the second channel.

2. The memory device of claim 1, wherein the plurality of channels are arranged in the first direction and a second direction that is parallel to the upper surface of the substrate and traverses the first direction, and the first gate pattern has a single plate shape covering a portion of each of the plurality of channels.

3. The memory device of claim 1, wherein the second gate pattern extends in the first direction.

4. The memory device of claim 3, wherein the first and second channels are spaced apart in the first direction, and
    wherein each of the selection gate pattern and the second gate pattern covers the portion of the first channel and a portion of the second channel.

5. The memory device of claim 1, wherein a bit line is electrically connected to the drain region, and the bit line extends in a second direction that is perpendicular to the first direction.

6. The memory device of claim 1, wherein each of the plurality of channels includes a semiconductor material.

7. The memory device of claim 1, wherein the first gate pattern includes a first conductive material having a first work function, and the second gate pattern includes a second conductive material having a second work function that is different from the first work function.

8. The memory device of claim 1, wherein the first gate pattern includes a first conductive material having a first work function, and the second gate pattern includes a second conductive material having a second work function that is lower than the first work function.

9. The memory device of claim 1, wherein the second channel is spaced apart from the first channel in a second direction that is parallel to the upper surface of the substrate and traverses the first direction, and
    the selection gate pattern comprises a first selection gate pattern that covers the portion of the first channel and a second selection gate pattern that covers a portion of the second channel and is spaced apart from the first selection gate pattern in the second direction.

10. The memory device of claim 1, wherein the selection gate pattern, the first gate pattern and the second gate pattern are between the source region and the drain region, and
    wherein the selection gate pattern is not between the first and second gate patterns.

11. The memory device of claim 1, wherein at least two of the first gate pattern, the second gate pattern, the source region, and the drain region are electrically connected to each other.

12. The memory device of claim 1, wherein the first gate pattern and the source region are electrically connected to each other.

13. A memory device, comprising:
- a source region including first impurities having a first conductivity type at an upper portion of a substrate;
- a plurality of channels contacting the source region, each of the plurality of channels extending in a vertical direction that is perpendicular to an upper surface of the substrate, the plurality of channels being arranged in first and second directions that are parallel to the upper surface of the substrate and are perpendicular to each other, and the plurality of channels comprising a first channel, a second channel that is spaced apart from the first channel in the first direction, and a third channel that is spaced apart from the first channel in the second direction;
- a gate insulation layer pattern covering a portion of the first channel;
- a selection gate pattern on the gate insulation layer pattern, the selection gate pattern covering the portion of the first channel and a portion of the second channel and extending in the first direction;
- a first gate pattern on the gate insulation layer pattern;
- a second gate pattern on the gate insulation layer pattern, the second gate pattern covering the portions of the first and second channels and extending in the first direction;
- a drain region including second impurities having a second conductivity type that is different from the first conductivity type at an upper portion of the first channel; and
- a bit line electrically connected to the drain region, the bit line extending in the second direction,
- wherein the selection gate pattern, the first gate pattern, and the second gate pattern are spaced apart from each other in the vertical direction, and
- wherein the first gate pattern covers the portions of the first and second channels and a portion of the third channel and is a common gate of the first, second, and third channels.

14. The memory device of claim 13, wherein the first gate pattern is a single pattern covering the portions of the first, second, and third channels.

15. The memory device of claim 13, wherein the first gate pattern includes a first conductive material having a first work function, and the second gate pattern includes a second conductive material having a second work function that is lower than the first work function.

16. The memory device of claim 13, wherein the selection gate pattern comprises a first selection gate pattern that covers the portion of the first channel and a second selection gate pattern that covers the portion of the third channel and is spaced apart from the first selection gate pattern in the second direction.

17. A semiconductor device, comprising:
- a source region including first impurities having a first conductivity type at an upper portion of a substrate;
- a plurality of channels contacting the source region, each of the plurality of channels extending in a vertical direction that is perpendicular to an upper surface of the substrate;
- a plurality of selection gate patterns on sidewalls of the plurality of channels, respectively;
- a first gate pattern on the sidewalls of the plurality of channels;
- a plurality of second gate patterns on the sidewalls of the plurality of channels, respectively; and
- a plurality of drain regions including second impurities having a second conductivity type that is different from the first conductivity type at respective upper portions of the plurality of channels.

18. The semiconductor device of claim 17, wherein the first gate pattern includes a first conductive material having a first work function, and the plurality of second gate patterns include a second conductive material having a second work function that is lower than the first work function.

19. The semiconductor device of claim 17, wherein the plurality of drain regions are spaced apart from the source region in the vertical direction, and the plurality of selection gate patterns, the first gate pattern, the plurality of second gate patterns are between the plurality of drain regions and the source region.

20. The semiconductor device of claim 17, further comprising a bit line electrically connected to one of the plurality of drain regions.

* * * * *